(12) United States Patent
Jang

(10) Patent No.: US 7,825,887 B2
(45) Date of Patent: Nov. 2, 2010

(54) GATE DRIVER

(75) Inventor: Yong Ho Jang, Seongnam-si (KR)

(73) Assignee: LG. Display Co., Ltd., Seoul (KR)

( * ) Notice: Subject to any disclaimer, the term of this patent is extended or adjusted under 35 U.S.C. 154(b) by 991 days.

(21) Appl. No.: 11/639,953

(22) Filed: Dec. 15, 2006

(65) Prior Publication Data
US 2007/0182688 A1 Aug. 9, 2007

(30) Foreign Application Priority Data
Feb. 6, 2006 (KR) ...................... 10-2006-0011294

(51) Int. Cl.
*G09G 3/36* (2006.01)
(52) U.S. Cl. ...................... 345/100; 345/98; 345/204; 345/211; 345/209
(58) Field of Classification Search ........... 345/87–100, 345/204–215, 690; 315/169.1, 169.4
See application file for complete search history.

(56) References Cited

U.S. PATENT DOCUMENTS

| 5,648,790 A * | 7/1997 | Lee .............................. 345/58 |
| 7,586,476 B2 * | 9/2009 | Kwon et al. .................. 345/98 |
| 2005/0156855 A1 * | 7/2005 | Jang et al. .................... 345/100 |
| 2005/0212746 A1 * | 9/2005 | Iwasaki et al. ............... 345/100 |
| 2006/0139294 A1 * | 6/2006 | Tanaka et al. ................ 345/100 |

* cited by examiner

*Primary Examiner*—Lun-Yi Lao
*Assistant Examiner*—Olga Merkoulova
(74) *Attorney, Agent, or Firm*—Brinks Hofer Gilson & Lione

(57) ABSTRACT

A gate driver includes a plurality of stage groups, a gate driving circuit, and an output controller. The gate driving circuit supplies the plurality of stage groups with a plurality of clock pulses. The plurality of stage groups supply the input clock pulses to associated gate lines of a liquid crystal panel. The output controller generates a plurality of control voltage signals that control which of the plurality of stage groups generate an output signal.

14 Claims, 22 Drawing Sheets

GATE DRIVER

PRIORITY CLAIM

This application claims the benefit from Korean Patent Application No. P 2006-011294, filed Feb. 6, 2006, which is incorporated by reference.

BACKGROUND OF THE INVENTION

1. Technical Field

The present invention relates to a gate driver, and more particularly, to a gate driver capable of reducing the number of gate-driving integrated circuits.

2. Related Art

Liquid crystal display (LCD) devices may display an image by using an electric field to control the light transmittance of liquid crystal having a dielectric anisotropy. Some LCD devices include an LCD panel having a pixel matrix, and a driving circuit for driving the LCD panel.

FIG. 1 is a block diagram of a related art LCD device. In FIG. 1, the related art LCD device includes a liquid crystal panel 2. The liquid crystal panel 2 includes a pixel matrix. The LCD device may also include a gate driver 4 for driving gate lines GL1 to GLn of the liquid crystal panel 2, a data driver 6 for driving data lines DL1 to DLm of the liquid crystal panel 2, and a timing controller 8 for controlling driving timings of the gate driver 4 and data driver 6.

The pixel matrix of the liquid crystal panel 2 includes pixels formed in regions defined by intersections of the gate lines and data lines. Each pixel includes a liquid crystal cell Clc for controlling an amount of light passing through the pixel, and a thin film transistor (TFT) for driving the liquid crystal cell Clc.

Each TFT is turned on in response to a scan signal, such as a gate high voltage, VGH, supplied from an associated gate line GL. In an ON state, the TFT may supply a pixel signal, received from the associated data line DL, to an associated liquid crystal cell Clc. Each TFT is turned off in response to a gate low voltage VGL supplied from the associated gate line GL. In the OFF state of the TFT, the pixel signal charged in the associated liquid crystal cell Clc is sustained.

Each liquid crystal cell Clc can be equivalently represented as a capacitor. Each liquid crystal cell Clc includes a common electrode and a pixel electrode facing each other at opposite sides of the liquid crystal cell Clc. The pixel electrode is connected to the associated TFT. Each liquid crystal cell Clc may further include a storage capacitor (not shown) which may sustain the charged pixel signal until the next pixel signal is charged. In accordance with this structure, the orientation of the liquid crystal in each liquid crystal cell Clc is varied in accordance with the pixel signal charged via the associated TFT because the liquid crystal has a dielectric anisotropy, thereby causing the light transmittance of the liquid crystal to be adjusted. Thus, a desired gray scale is obtained.

The gate driver 4 shifts a gate start pulse, GSP, supplied from the timing controller 8 in response to gate shift clocks, GSC. The gate driver 4 can sequentially supply the shifted pulses as scan pulses having a gate high voltage, VGH, to the gate lines GL1 to GLm, respectively. In a period when no scan pulse has a gate high voltage, VGH, the gate driver 4 supplies a gate low voltage, VGL. The gate driver 4 includes a plurality of gate-driving integrated circuits (ICs) to drive the gate lines GL1 to GLn in a grouped manner.

The gate-driving ICs may be mounted on tape carrier packages, TCPs, in a grouped state so that they are connected to the liquid crystal panel 2. The TCPs carrying the gate-driving ICs are attached to the liquid crystal panel 2 through a tape automated bonding, TAB, process.

In the related art LCD device using a plurality of gate-driving ICs to drive the gate lines GL1 to GLn, an increase in manufacturing costs occurs when the number of the gate lines is increased to obtain a desired resolution. The increase in the number of gate lines causes an increase in the number of gate-driving ICs and the number of TCPs. Therefore, there is a need for an improved gate driver.

SUMMARY OF THE INVENTION

A gate driver includes a plurality of stage groups, a gate driving circuit, and an output controller. The gate driving circuit supplies the plurality of stage groups with a plurality of clock pulses. The plurality of stage groups supply the input clock pulses to associated gate lines of a liquid crystal panel. The output controller generates a plurality of control voltage signals that control which of the plurality of stage groups generate an output signal.

Other systems, methods, features and advantages will be or will become apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

PREFERRED EMBODIMENTS

Figure 1:
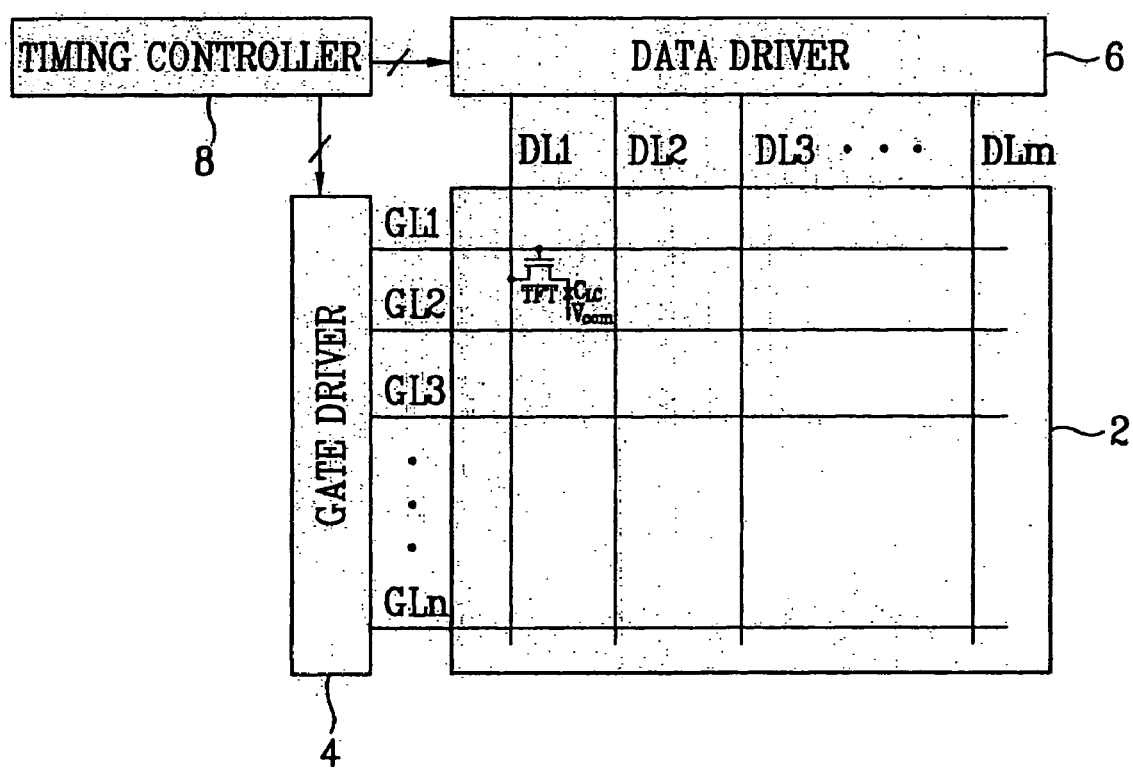
FIG. 1 is a block diagram of a related art liquid crystal display device.
Figure 2:
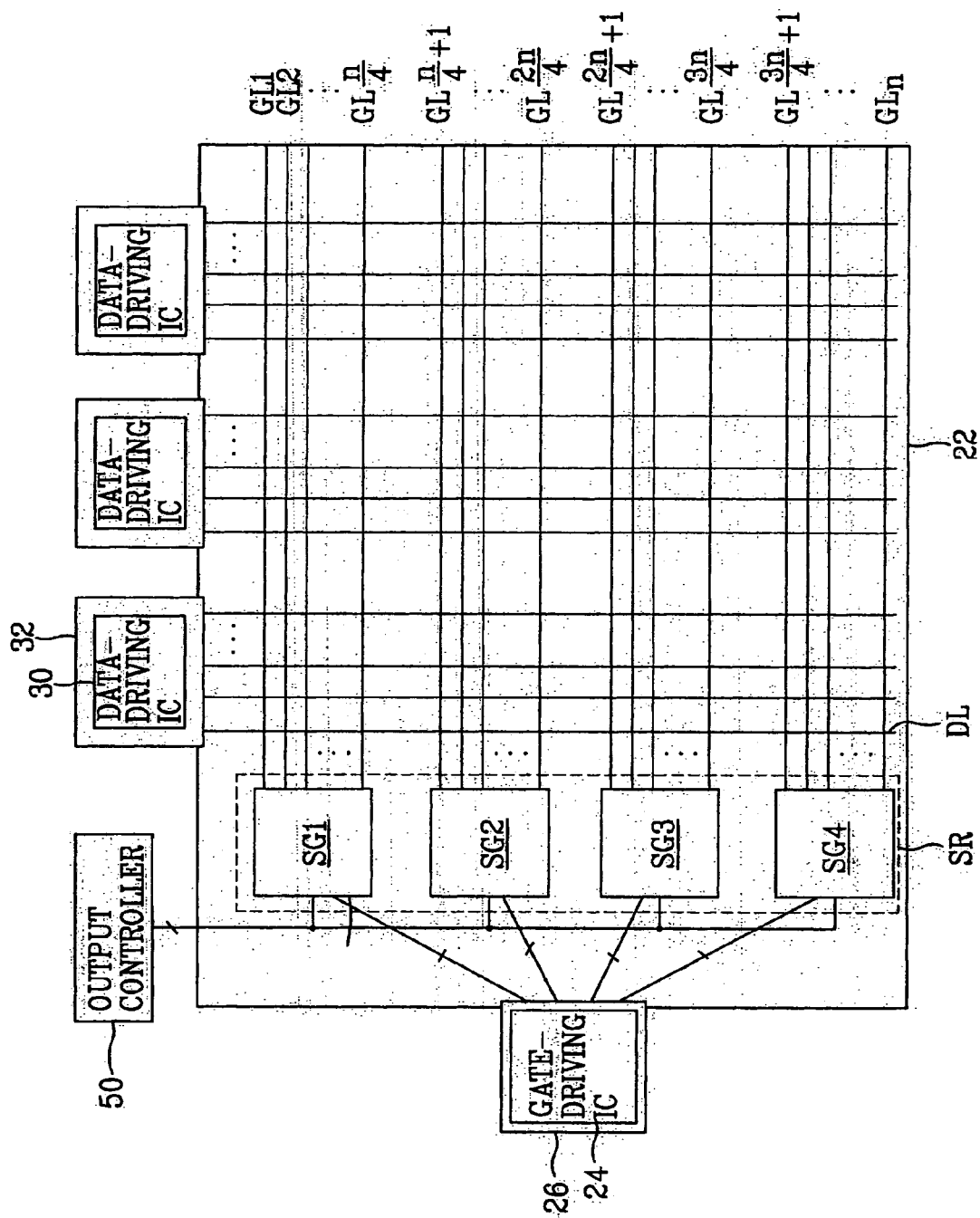
FIG. 2 is a block diagram of a liquid crystal display device with a single gate-driving integrated circuit.

FIG. 2 is a block diagram of a liquid crystal display (LCD) device with a single gate-driving integrated circuit (IC). In FIG. 2, the LCD device includes a liquid crystal panel 22 that may display an image, a shift register SR mounted in the liquid crystal panel 22, a gate TCP 26 connected to one side of the liquid crystal panel 22, a gate-driving IC 24 mounted on the gate TCP 26, and an output controller 50 which may control an output from the shift register SR.

The liquid crystal panel 22 is formed with a plurality of gate lines GL1 to GLn arranged in one direction, and a plurality of data lines DL1 to DLm arranged to intersect the gate lines GL1 to GLn. Pixels may be formed in regions that intersect the gate lines GL1 to GLn and data lines DL1 to DLm. A plurality of data TCPs 32 may be connected to a side of the liquid crystal panel 22 that is not connected to the gate TCP 26. A data-driving IC may be mounted on each data TCP 32. The data lines may be divided into data line groups corresponding to the data TCPs 32 so that the data lines of a data line group may be driven by a data-driving IC 30 of the associated data TCP 32.

The gate-driving IC 24 may output a plurality of phase-different clock pulses. The clock pulses may be supplied to the shift register SR. The shift register SR may include a plurality of stages for receiving the clock pulses from the gate-driving IC 24. The shift register SR may supply the received clock pulses, as scan pluses, to an associated gate line The shift register SR may be divided into m stage groups having n stages, where "m" and "n" may be natural numbers greater than or equal to 2. In FIG. 2, the shift register SR includes 4 stage groups: SG1, SG2, SG3, and SG4. The gate-driving IC 24 may supply n phase-different clock pulses to each of the stage groups.

Figure 3:
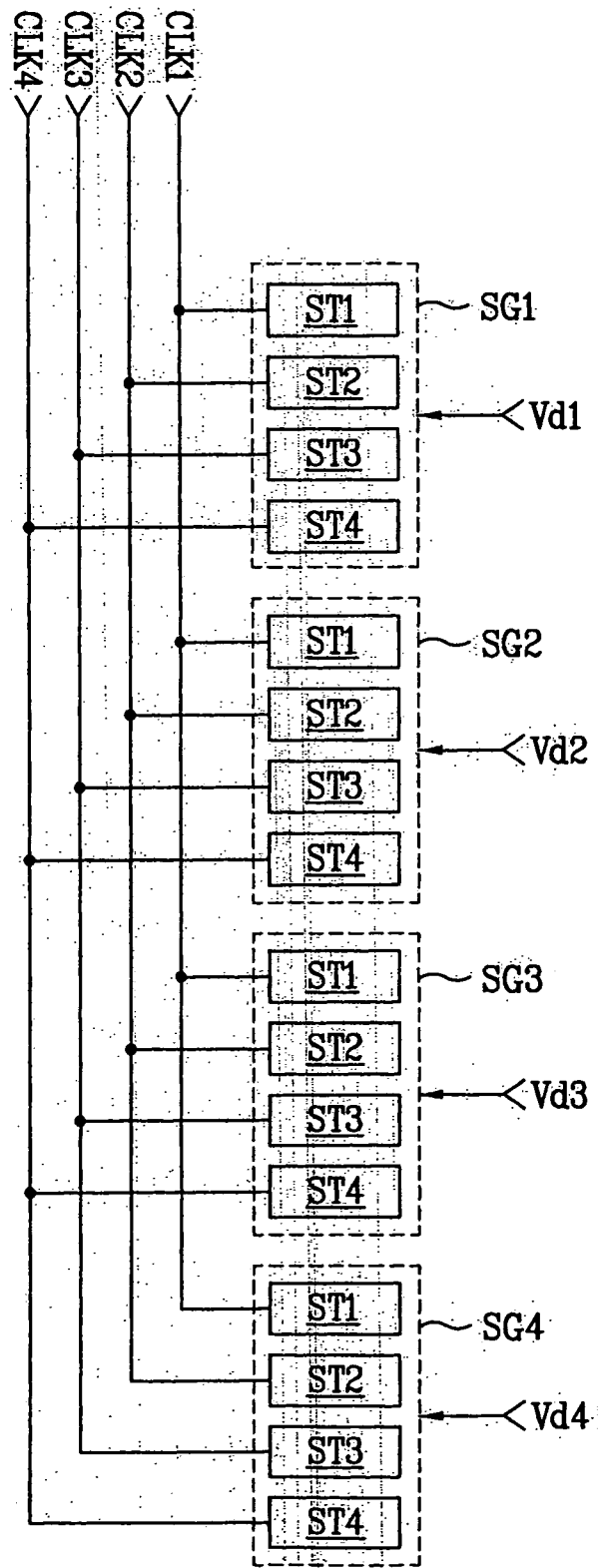
FIG. 3 is a block diagram of a shift register of FIG. 2.
Figure 4:
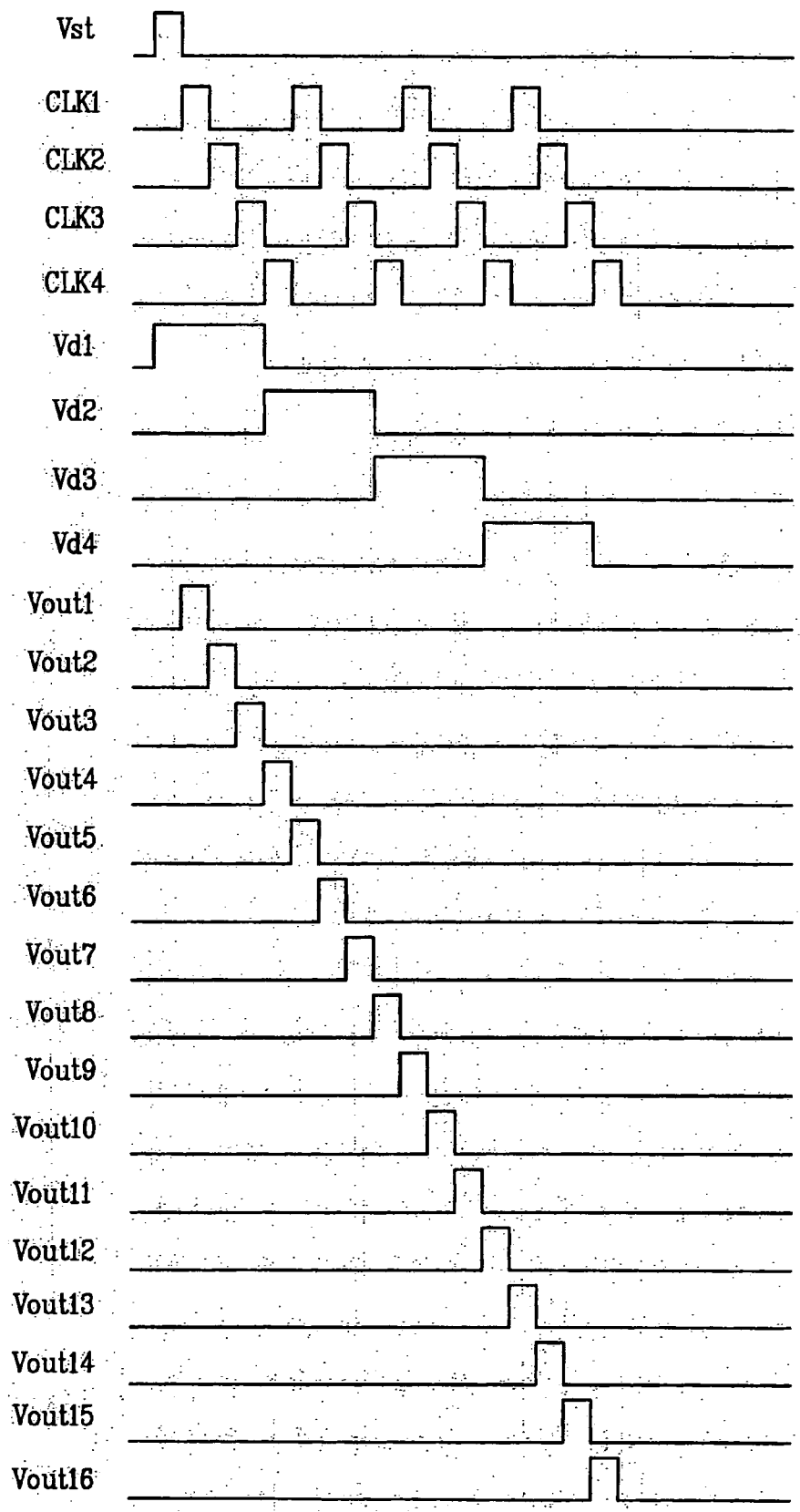
FIG. 4 is a timing diagram of various signals.

FIG. 3 is a block diagram of a shift register shown in FIG. 2. FIG. 4 is a timing diagram of various signals. Some of these signals may be supplied to a shift register of FIG. 2. Other of these signals may be output by the shift register of FIG. 2. In FIG. 3, the shift register SR includes four stage groups: SG1, SG2, SG3, and SG4. Each of the stage groups may include four stages: ST1, ST2, ST3, and ST4. Four clock pulses: CLK1, CLK2, CLK3, and CLK4, may be supplied by the gate-driving IC 24. Alternatively, more or less stage groups and/or stages may be configured in shift register SR.

The first to fourth clock pulses CLK1, CLK2, CLK3, and CLK4 may be input to each of the stage groups SG1, SG2, SG3, and SG4 and may be supplied to the first to fourth stages, ST1 to ST4, included in each of the stage groups. For stage group SG1, stage ST1 may receive clock pulse CLK1, stage ST2 may receive clock pulse CLK2, stage ST3 may receive clock pulse CLK3, and stage ST4 may receive clock pulse CLK4. The other stages groups SG2, SG3, and SG4 may be similarly configured. Alternatively, one or more of the stage groups SG1, SG2, SG3, and/or SG4 may be configured to receive clock pulses CLK1, CLK2, CLK3, and/or CLK4 in a different order. In FIG. 3, some or all of the stages of the shift register SR may be controlled by using the clock pulses supplied from the single gate-driving IC 24.

Output controller 50 may control the output of the shift register SR stage groups (e.g., SG1, SG2, SG3, and/or SG4). In this way, during a period when one stage (e.g. ST1) of a stage group (e.g. SG1) outputs a scan pulse, the same stage (e.g. ST1) of another stage group (e.g. SG2, SG3, and/or SG4) may not produce an output scan pulse. The output controller 50 may therefore prevent two or more gate lines from being driven at the same or almost the same time.

The output controller 50 may also control the driving order of the stage groups. A driving order may include sequentially driving the stage groups, such as from the uppermost stage group to the lowermost stage group. Accordingly, for the shift register SR in FIG. 3, the output controller 50 may first drive stages ST1 to ST4 of the first stage group SG1, then drive stages ST1 to ST4 of the second stage group SG2, followed by driving stages ST1 to ST4 of the third stage group SG3, and lastly driving stages ST1 to ST4 of the fourth stage group SG4. In some LCD devices, the output controller 50 may be configured for different driving orders, such as the last stage group to the first stage group.

Each of the clock pulses CLK1 to CLK4 may be a signal that has a repeating high logic voltage and a low logic voltage at intervals of a predetermined period. Under the control of the output controller 50, each of the stages ST1 to ST4 may select one of the clock pulses and output the selected high logic voltage. The output high logic voltage may function as a scan pulse for driving a corresponding one of the gate lines GL1 to GLn of the liquid crystal panel 22. In some LCD devices, the signal output by a stage may be a scaled version of an input signal.

Figure 5:
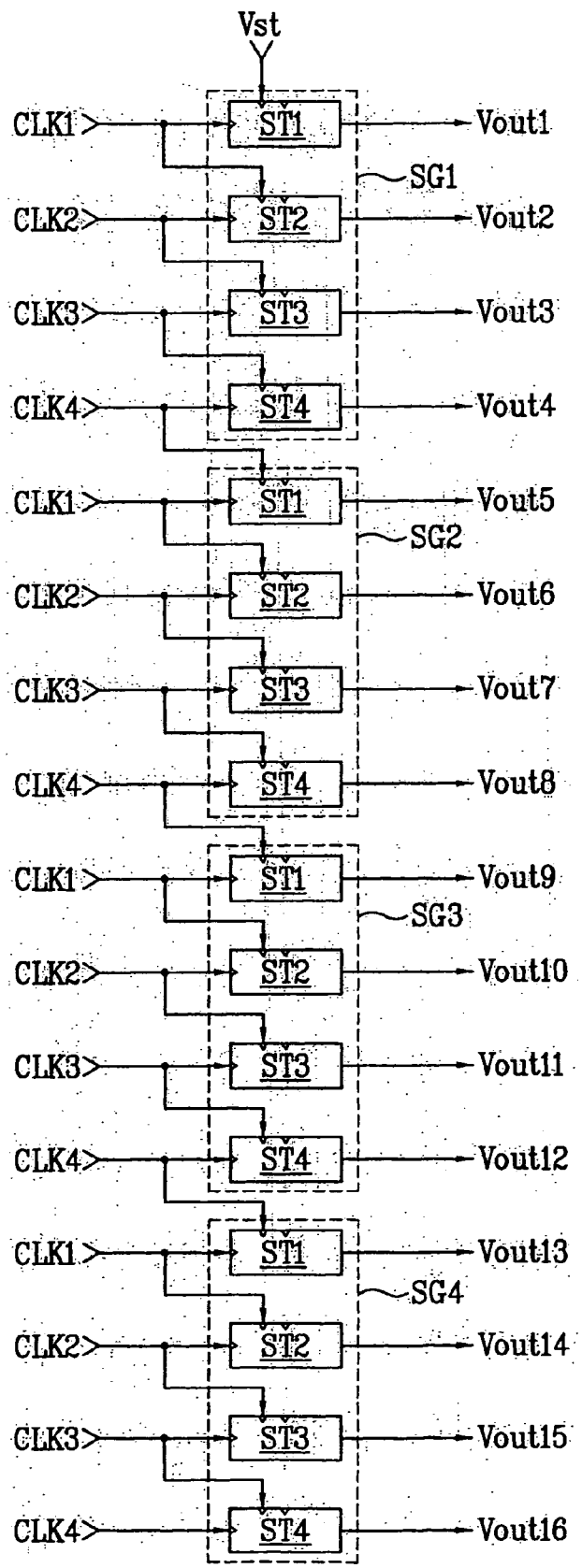
FIG. 5 is a second block diagram of a shift register of FIG. 2.

FIG. 5 is a second block diagram of a shift register of FIG. 2. In FIG. 5, the shift register SR may include a plurality of stage groups, for example, four stage groups SG1, SG2, SG3, and SG4, each including a plurality of stages, for example, four stages ST1, ST2, ST3, and ST4. The k-th stage ("k" may be a natural number greater than or equal to 2) of each stage group SG1, SG2, SG3, or SG4 may be enabled in response to a "k−1"-th clock pulse supplied from the gate-driving IC 24. In an enabled state, the k-th stage may output as a scan pulse a k-th clock pulse supplied from the gate-driving IC 24.

Figure 6:
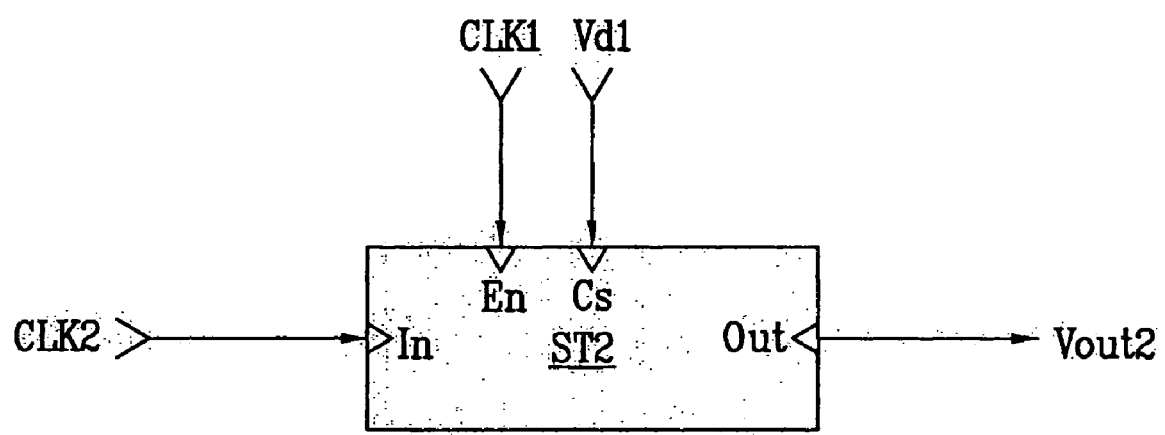
FIG. 6 is a block diagram of a second stage of a stage group of FIG. 5.

FIG. 6 is a block diagram of a second stage, ST2, of a stage group of FIG. 5. The second stage ST2 may include an enable terminal En, an input terminal In, an output terminal Out, and a control terminal Cs. As shown in FIG. 5, the k-th stage of each stage group SG1, SG2, SG3, or SG4 may be enabled in response to a "k−1"-th clock pulse supplied from the gate-driving IC 24 through the enable terminal En of the k-th stage. In an enabled state, the k-th stage may receive a k-th clock pulse which may be supplied from the gate-driving IC 24 through the input terminal In of the k-th stage. The k-th stage may output, as a scan pulse, a clock pulse to an associated gate line through the output terminal Out.

In FIG. 5, the first stage ST1 of the first stage group SG1 may be enabled by a start pulse Vst supplied through the enable terminal En. In the enabled state, the first stage ST1 of the first stage group SG1 receives the first clock pulse CLK1, and outputs the received first clock pulse CLK1 as the first scan pulse Vout1. The k-th clock pulse supplied to each stage group SG1, SG2, SG3, or SG4 may be supplied to both the input terminal In of the k-th stage and the enable terminal En of the "k+1"-th stage in the stage group SG1, SG2, SG3, or SG4. Each stage group may be supplied with a number of clock pulses identical to the number of the stages included in the stage group. Each of the supplied clock pulses may be supplied to both the input terminal In of the current stage and the enable terminal En of the next stage.

The last clock pulse supplied to each stage group SG1, SG2, SG3, or SG4 (e.g., the fourth clock pulse CLK4) may be supplied to the enable terminal En of the first stage ST1 of the next stage group. In FIG. 5, the fourth clock pulse CLK4 supplied to the second stage group SG2 is input to both the input terminal In of the fourth stage ST4 of the second stage group SG2 and the enable terminal En of the first stage ST1 of the third stage group SG3.

A control signal from the output controller 50 may be supplied to the control terminal Cs of each of the stages ST1 to ST4. Control voltages, such as Vd1 to Vd4 may be used as control signals. The number of control signals may be identical to the number of the stage groups in the shift register.

In FIG. 4, the first to fourth control voltages, Vd1 to Vd4, are phase-different DC voltages. The first control voltage Vd1 may be supplied to the control terminals Cs of the stages ST1 to ST4 included in the first stage group SG1. The second control voltage Vd2 may be supplied to the control terminals Cs of the stages ST1 to ST4 included in the second stage group SG2. The third control voltage Vd3 may be supplied to the control terminals Cs of the stages ST1 to ST4 included in the third stage group SG3. The fourth control voltage Vd4 may be supplied to the control terminals Cs of the stages ST1 to ST4 included in the fourth stage group SG4.

In FIG. 4, the first control voltage Vd1 may be maintained in a high state during a first enable period. The first control voltage Vd1 may have a high logic voltage level during a first enable period which may span from the point of time when the high logic voltage of the start pulse Vst rises to the point of time when the first high logic voltage of the third clock pulse CLK3 falls. During the first enable period, the first control voltage Vd1 may be maintained in a high logic voltage state until the first to fourth stages ST1 to ST4 of the first stage group SG1 are enabled. Accordingly, the first control voltage Vd1 may be maintained in a high logic voltage state until a clock pulse is supplied once to each enable terminal En of the first to fourth stages ST1 to ST4 included in the first stage group SG1. In periods other than the first enable period, the first control voltage Vd1 may have a low logic voltage level.

The first to fourth stages ST1 to ST4 included in the first stage group SG1 may be sequentially enabled during the first enable period. In the enable state, each of the first to fourth stages ST1 to ST4 may supply an associated one of the clock pulses CLK1 to CLK4 applied to the input terminal In of an associated gate line as an output scan pulse Vout1 to Vout4, respectively.

As shown in FIG. 4, the second control voltage Vd2 may be maintained in a high state during a second enable period. The second control voltage Vd2 may have a high logic voltage level during a second enable period which may span from the point of time when the first high logic voltage of the fourth clock pulse CLK4 rises to the point of time when the second high logic voltage of the third clock pulse CLK3 falls. During the second enable period, the second control voltage Vd2 may be maintained in a high logic voltage state until the first to fourth stages ST1 to ST4 of the second stage group SG2 are enabled. Accordingly, the second control voltage Vd2 may be maintained in a high logic voltage state until a clock pulse is supplied once to each enable terminal En of the first to fourth stages ST1 to ST4 included in the second stage group SG2. In periods other than the second enable period, the second control voltage Vd2 has a low logic voltage level.

The first to fourth stages ST1 to ST4 included in the second stage group SG2 may be sequentially enabled during the second enable period. In the enable state, each of the first to fourth stages ST1 to ST4 may supplies an associated one of the clock pulses CLK1 to CLK4 applied to the input terminal In of an associated gate line as an output scan pulse Vout5 to Vout8, respectively.

In FIG. 4, the third control voltage Vd3 may be maintained in a high state during a third enable period. The third control voltage Vd3 may have a high logic voltage level during a third enable period which may span from the point of time when the second high logic voltage of the fourth clock pulse CLK4 rises to the point of time when the third high logic voltage of the third clock pulse CLK3 falls. During the third enable period, the third control voltage Vd3 may be maintained in a high logic voltage state until the first to fourth stages ST1 to ST4 of the third stage group SG3 are enabled. Accordingly, the third control voltage Vd3 may be maintained in a high logic voltage state until a clock pulse is supplied once to each enable terminal En of the first to fourth stages ST1 to ST4 included in the third stage group SG3. In periods other than the third enable period, the third control voltage Vd3 has a low logic voltage level.

The first to fourth stages ST1 to ST4 included in the third stage group SG3 may be sequentially enabled during the third enable period. In the enable state, each of the first to fourth stages ST1 to ST4 may supplies an associated one of the clock pulses CLK1 to CLK4 applied to the input terminal In of an associated gate line as an output scan pulse Vout9 to Vout12, respectively.

In FIG. 4, the fourth control voltage Vd4 may be maintained in a high state during a fourth enable period. The fourth control voltage Vd4 may have a high logic voltage level during a fourth enable period which may span from the point of time when the third high logic voltage of the fourth clock pulse CLK4 rises to the point of time when the fourth high logic voltage of the third clock pulse CLK3 falls. During the fourth enable period, the fourth control voltage Vd4 may be maintained in a high logic voltage state until the first to fourth stages ST1 to ST4 of the fourth stage group SG4 are enabled. Accordingly, the fourth control voltage Vd4 may be maintained in a high logic voltage state until a clock pulse is supplied once to each enable terminal En of the first to fourth stages ST1 to ST4 included in the fourth stage group SG4. In periods other than the fourth enable period, the fourth control voltage Vd4 has a low logic voltage level.

The first to fourth stages ST1 to ST4 included in the fourth stage group SG4 may be sequentially enabled during the fourth enable period. In the enable state, each of the first to fourth stages ST1 to ST4 may supply an associated one of the clock pulses CLK1 to CLK4 applied to the input terminal In of an associated gate line as an output scan pulse Vout13 to Vout16, respectively.

Alternatively, the control voltages Vd1 to Vd4 may be overlapped with one another for a predetermined period. For example, the first control voltage Vd1 may have a high logic voltage level during a first enable period which may span from the point of time when the high logic voltage of the start pulse Vst rises to the point of time when the first high logic voltage of the fourth clock pulse CLK4 falls. The second control voltage Vd2 may have a high logic voltage level during a second enable period which may span from the point of time when the first high logic voltage of the fourth clock pulse CLK4 rises to the point of time when the second high logic voltage of the fourth clock pulse CLK4 falls. The third control voltage Vd3 may have a high logic voltage level during a third enable period which may span from the point of time when the second high logic voltage of the fourth clock pulse CLK4 rises to the point of time when the third high logic voltage of the fourth clock pulse CLK4 falls. The fourth control voltage Vd4 may have a high logic voltage level during a fourth enable period which may span from the point of time when the third high logic voltage of the fourth clock pulse CLK4 rises to the point of time when the fourth high logic voltage of the fourth clock pulse CLK4 falls.

Figure 7:
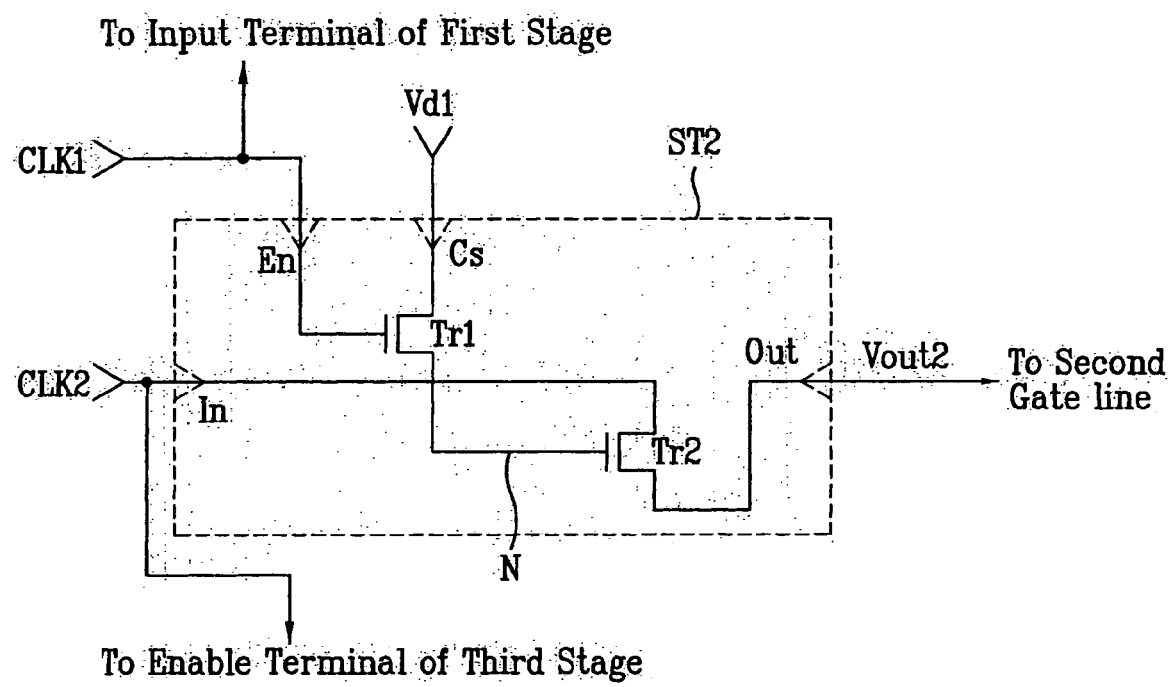
FIG. 7 is a circuit diagram of a second stage included in the first stage group of FIG. 5.

FIG. 7 is a circuit diagram of a second stage included in the first stage group of FIG. 5. The stage may include a first switching device Tr1, and a second switching device Tr2. When the stage is enabled, the first switching device Tr1 of the stage may supply a control voltage to a node N in response to a "k−1"-th clock pulse received at the input terminal In. The node N may be charged or discharged in accordance with the logic level of the control voltage. Stages ST1, ST3, and/or ST4 may have similar configuration.

In FIG. 7, the gate terminal of the first switching device Tr1 is connected, at the enable terminal En, to the output terminal of the gate-driving IC 24 which may supply the "k−1"-th clock pulse. The drain terminal of the first switching device Tr1 is connected, at the control terminal Cs, to the output terminal of the output controller 50 which may supply a control voltage. The source terminal of the first switching device is connected to the node N.

In FIG. 7, the second switching device Tr2 may control the stage's output in accordance with the state of the node N. The second switching device Tr2 may output the input clock pulse, as a scan pulse, when the node N is in a charging state. When the node N is in a discharging state, the second switching device Tr2 may prevent the output of the input clock pulse.

In FIG. 7, the gate terminal of the second switching device Tr2 is connected to the node N. The drain terminal of the second switching device Tr2 is connected, at the input terminal In, to the output terminal of the gate-driving IC 24 which may supply the input clock pulse. The source terminal of the second switching device Tr2 is connected to an associated gate line through the output terminal Out.

As shown in FIG. 7, the stage may be configured such that the first switching device Tr1 included in the second stage ST2 of the first stage group SG1 may charge or discharge the node N with the first control voltage Vd1 in response to the first clock pulse CLK1. The second switching device Tr2 may output the second clock pulse CLK2 to the second gate line depending on the state of the node N.

The first clock pulse CLK1 may also be supplied to the second switching device Tr2 included in the first stage ST1 of the first stage group SG1. Additionally, the second clock pulse CLK2 may also be supplied to the first switching device Tr1 included in the third stage ST3 of the first stage group SG1.

If the first control voltage Vd1 has a high logic level, and the remaining second to fourth control voltages Vd2 to Vd4 have a low logic level, the second stage ST2 of the first stage group SG1 may output the second clock pulse CLK2 as the second scan pulse Vout2. Additionally, each second stage ST2 of the second to fourth stage groups SG2 to SG4, to which the second to fourth control voltages Vd2 to Vd4 are applied, respectively, generates no output.

The first and second clock pulses CLK1 and CLK2 may also be supplied to the second stage ST2 of the other stage groups. The first clock pulse CLK1 may be supplied to the first switching device Tr1, and the second clock pulse CLK2 may be supplied to the second switching device Tr2. During a first enabling period, the node N of the other stage groups may be in a discharging state when the control voltages supplied to the node N through the first switching device Tr1 is at a low logic level. As a result, the second switching device Tr2 will be turned off. Accordingly, the second clock pulse CLK2 supplied to the drain terminal of the second switching devices Tr2 will not be output. Therefore, when the second stage ST2 of the first stage group SG1 generates an output, the second stage ST2 of the remaining stage groups may be configured to generate no output.

Figure 8:
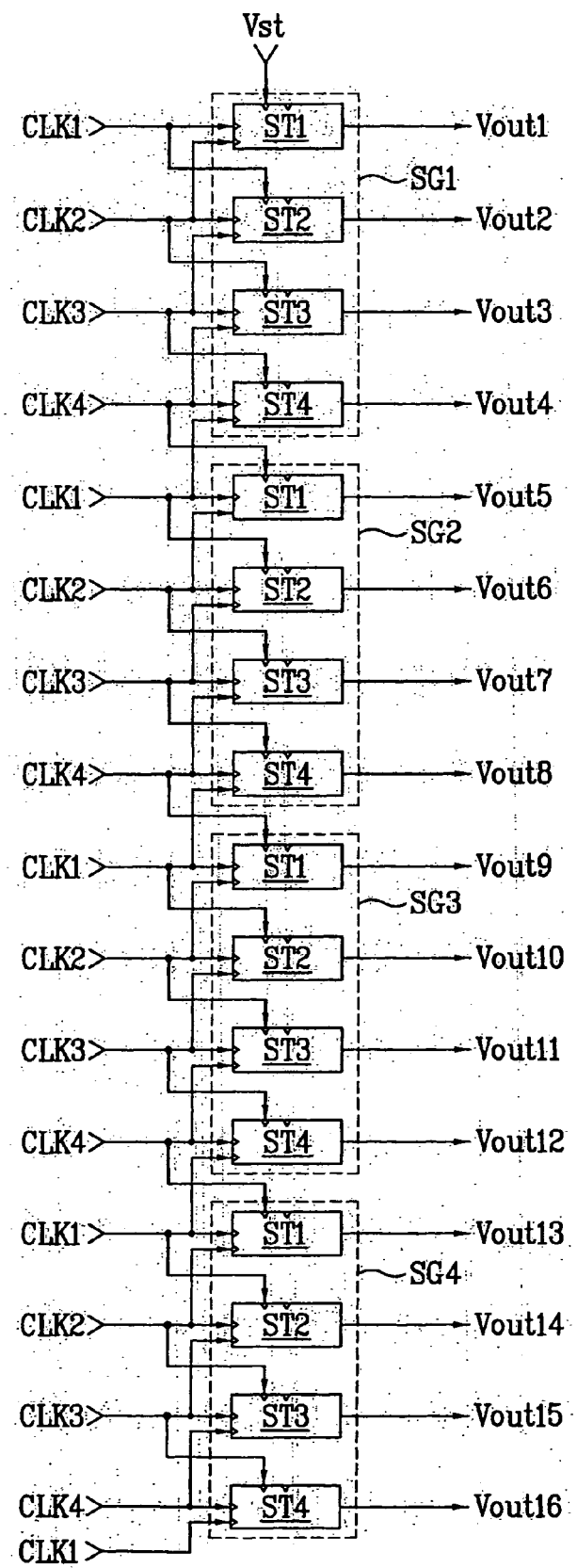
FIG. 8 is a third block diagram of a shift register of FIG. 2.

FIG. 8 is a third block diagram of a shift register of FIG. 2. In FIG. 8, the k-th stage ("k" is a natural number greater than or equal to 2) of each stage group SG1, SG2, SG3, or SG4 may be enabled in response to a "k−1"-th clock pulse supplied from the gate-driving IC 24. In an enabled state, the k-th stage may output a k-th clock pulse which may be supplied from the gate-driving IC 24, as a scan pulse. However, the k-th stage of each stage group SG1, SG2, SG3, or SG4 may be disabled in response to a "k+1"-th clock pulse which may be supplied from the gate-driving IC 24.

Figure 9:
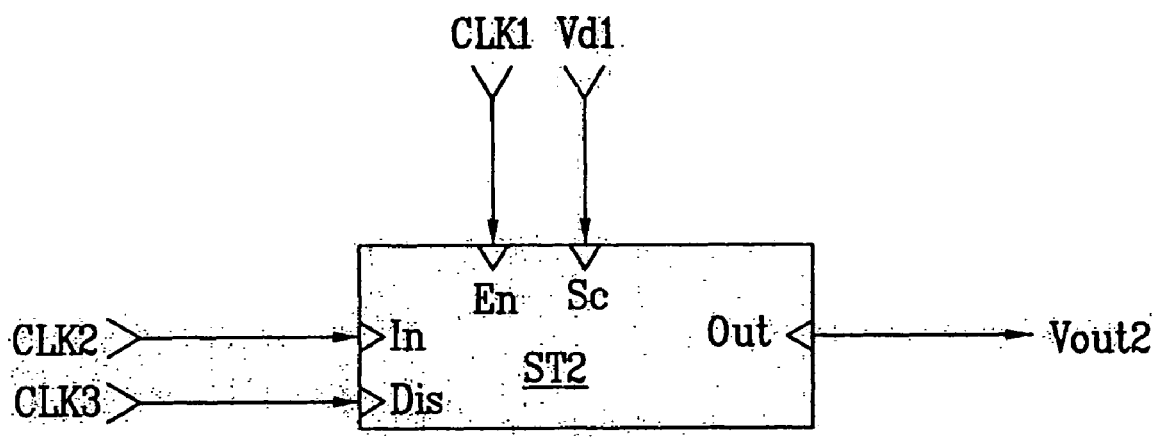
FIG. 9 is a block diagram of a second stage included in a first stage group shown in FIG. 8.

FIG. 9 is a block diagram of a second stage, ST2, of a stage group of FIG. 8. In FIG. 9, the second stage ST2 may have an enable terminal En, a disable terminal Dis, an input terminal In, an output terminal Out, and a control terminal Cs. As shown in FIG. 8, a k-th stage of each stage group SG1, SG2, SG3, or SG4 may be enabled in response to a "k−1"-th clock pulse which may be supplied from the gate-driving IC 24 through the enable terminal En of the k-th stage. In an enabled state, the k-th stage may receive a k-th clock pulse which may be supplied from the gate-driving IC 24 through the input terminal In of the k-th stage. The k-th clock pulse may be supplied, as a scan pulse, to an associated gate line through the output terminal Out of the k-th stage. The k-th stage may be disabled in response to a "k+1"-th clock pulse which may be supplied from the gate-driving IC 24.

The first stage ST1 of the first stage group SG1 may be enabled by a start pulse Vst supplied through the enable terminal En. In an enabled state, the first stage ST1 of the first stage group SG1 may receive the first clock pulse CLK1, and may output the received first clock pulse CLK1 as the first scan pulse Vout1. The first stage ST1 of the first stage group SG1 may be disabled by supplying the second clock pulse CLK2 to the disable terminal Dis of the first stage ST1.

The k-th clock pulse supplied to each stage group SG1, SG2, SG3, or SG4 may be supplied to the input terminal In of the k-th stage, the enable terminal En of the "k+1"-th stage, and the disable terminal Dis of the "k−1"-th stage in the stage group SG1, SG2, SG3, or SG4. Each stage group may be supplied with a number of clock pulses that that is identical to the number of stages included in the stage group. Each of the supplied clock pulses may be supplied to the input terminal In of a current stage, the enable terminal En of a next stage, and the disable terminal Dis of a previous stage. The last clock pulse supplied to each stage group SG1, SG2, SG3, or SG4 (e.g., the fourth clock pulse CLK4) may be supplied to the input terminal In of the last stage (e.g., the fourth stage ST4) in a current stage group, the disable terminal Dis of a previous stage (e.g., the third stage ST3) in a current stage group, and the enable terminal En of a first stage (e.g., the first stage ST1) in a next stage group. The first clock pulse supplied to each of the stage groups, except for the first stage group, may be supplied to the input terminal In of a first stage, the enable terminal En of a second stage, and the disable terminal Dis of a last stage in the previous stage group.

A control signal from the output controller 50 may be supplied to the control terminal Cs of each of the stages ST1 to ST4. Control voltages, such as Vd1 to Vd4 may be used as control signals. The number of control signals may be identical to the number of the stage groups in the shift register. The period of the first to fourth control voltages Vd1 to Vd4 may be as previously described.

Figure 10:
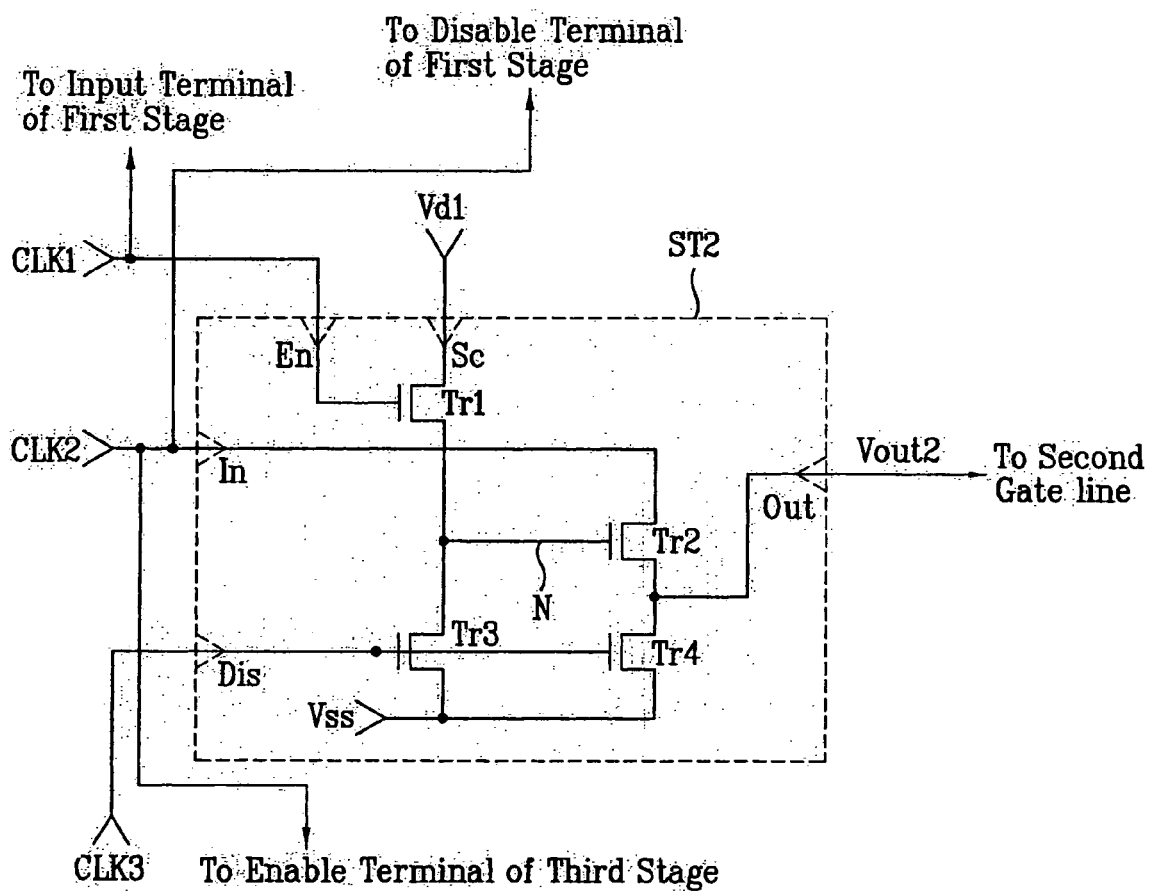
FIG. 10 is a circuit diagram of the second stage included in the first stage group of FIG. 8.

FIG. 10 is a circuit diagram of the second stage included in a first stage group of FIG. 8. The stage may include first to fourth switching devices Tr1 to Tr4. Stages ST1, ST3, and/or ST4 may have similar configurations.

When enabled, the first switching device Tr1 of a k-th stage supplies a control voltage to a node N in response to a "k−1"-th clock pulse received at the input terminal In. The node N may be charged or discharged in accordance with the logic level of the control voltage.

In FIG. 10, the gate terminal of the first switching device Tr1 is connected, at the enable terminal En, to the output terminal of the gate-driving IC 24 supplying the "k−1"-th clock pulse. The drain terminal of the first switching device Tr1 is connected, at the control terminal Cs, to the output terminal of the output controller 50 supplying the control voltage. The source terminal of the first switching device Tr1 is connected to the node N.

The second switching device Tr2 may control the stage's output in accordance with the state of the node N. The second switching device Tr2 may output the k-th clock pulse, as a scan pulse, when the node N is in a charging state. When the node N is in a discharging state, the second switching device Tr2 may prevent the output of the k-th clock pulse.

In FIG. 10, the gate terminal of the second switching device Tr2 is connected to the node N. The drain terminal of the second switching device Tr2 is connected, at the input terminal In, to the output terminal of the gate-driving IC 24 supplying the k-th clock pulse. The source terminal of the second switching device Tr2 is connected to an associated gate line through the output terminal Out.

The third switching device Tr3 of the k-th stage may discharge the node N with a discharging voltage Vss in accordance with a "k+1"-th clock pulse from the gate-driving IC 24. The gate terminal of the third switching device Tr3 is connected, through the discharge terminal Dis, to the output terminal of the gate-driving IC 24 supplying the "k+1"-th clock pulse. The drain terminal of the third switching device Tr3 is connected to the node N. The source terminal of the third switching device Tr3 is connected to a power supply line which supplies the discharging voltage Vss.

The fourth switching device Tr4 may output the discharging voltage Vss to an associated gate line in accordance with the "k+1"-th clock pulse from the gate-driving IC 24. The gate terminal of the fourth switching device Tr4 is connected, through the discharge terminal Dis, to the output terminal of the gate-driving IC 24 supplying the "k+1"-th clock pulse. The drain terminal of the fourth switching device Tr4 is connected to an associated gate line through the output terminal Out. The source terminal of the fourth switching device Tr4 is connected to the power supply line which supplies the discharging voltage Vss.

In FIG. 10, the first switching device Tr1 included in the second stage ST2 of the first stage group SG1 may charge or discharge the node N with the first control voltage Vd1 in response to the first clock pulse CLK1. The second switching device Tr2 may control the output of the second clock pulse CLK2 to a gate line according to the state of the node N. The third switching device Tr3 discharges the node N with the discharging voltage Vss in response to the third clock pulse CLK3. The fourth switching device Tr4 supplies the discharging voltage Vss to the associated gate line in response to the third clock pulse CLK3.

In FIG. 8, if the first control voltage Vd1 has a high logic level, and the remaining second to fourth control voltages Vd2 to Vd4 have a low logic level, then the second stage ST2 of the first stage group SG1 outputs the second clock pulse CLK2 as the second scan pulse Vout2. In response to the low logic level of the control voltages Vd2 to Vd4, the second stage ST2 of the second to fourth stage groups SG2 to SG4, to which the second to fourth control voltages Vd2 to Vd4 may be applied, respectively, generate no output.

The first and second clock pulses CLK1 and CLK2 may also be supplied to the second stage ST2 of the other stage groups. The first clock pulse CLK1 may be supplied to the first switching device Tr1. The second clock pulse CLK2 may be supplied to the second switching device Tr2. The node N in the second stages may be in a discharging state because the control voltages Vd2 to Vd4 supplied to the node N through the first switching device Tr1 has a low logic level. The node N may be discharged in accordance with the third clock pulse CLK3. As a result, the second switching device Tr2 connected to the node N, which is in a discharging state, is turned off. Accordingly, the second clock pulse CLK2 supplied to the second switching device Tr2 cannot be output. Thus, when the second stage ST2 of the first stage group SG1 generates an output, the second stage ST2 of the remaining stage groups do not generate an output.

Figure 11:
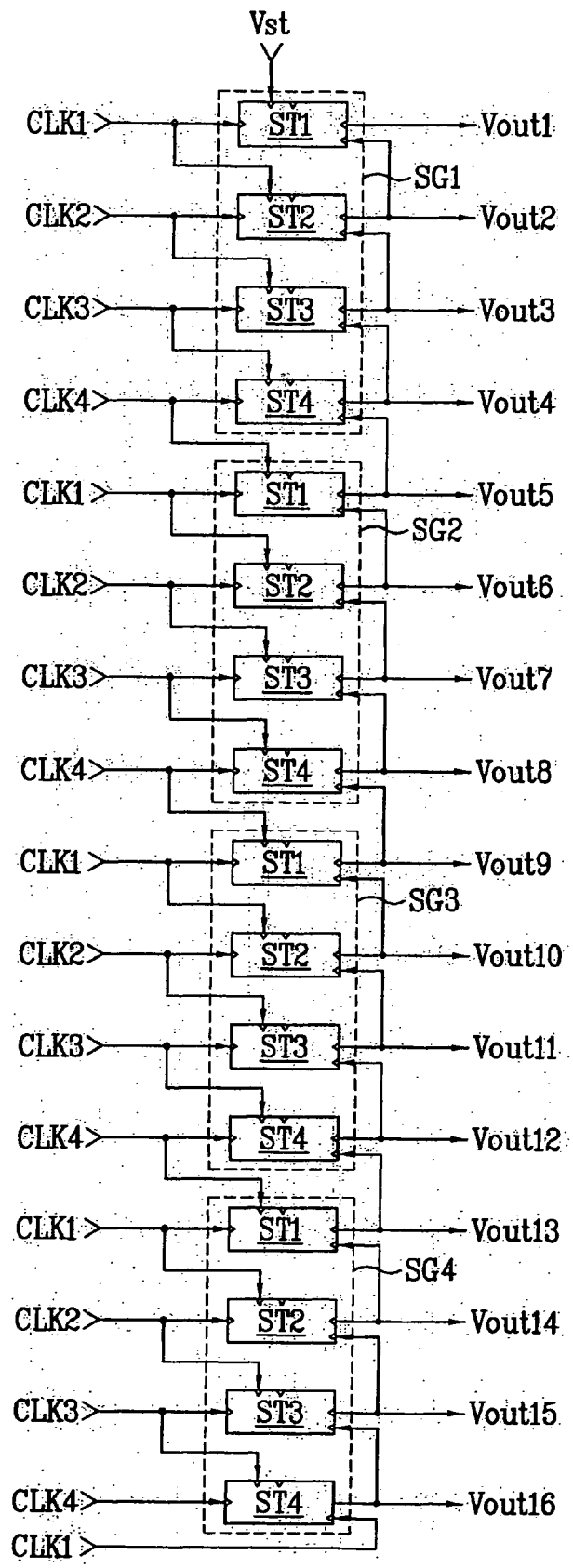
FIG. 11 is a fourth block diagram of a shift register of FIG. 2.

FIG. 11 is a fourth block diagram of a shift register of FIG. 2. In FIG. 11, the k-th stage ("k" may be a natural number greater than or equal to 2) of each stage group SG1, SG2, SG3, or SG4 may be enabled in response to a "k−1"-th clock pulse supplied from the gate-driving IC 24. In the enabled state, the k-th stage may output a k-th clock pulse supplied from the gate-driving IC 24, as a scan pulse. However, the k-th stage of each stage group SG1, SG2, SG3, or SG4 may be disabled in response to a "k+1"-th clock pulse.

Figure 12:
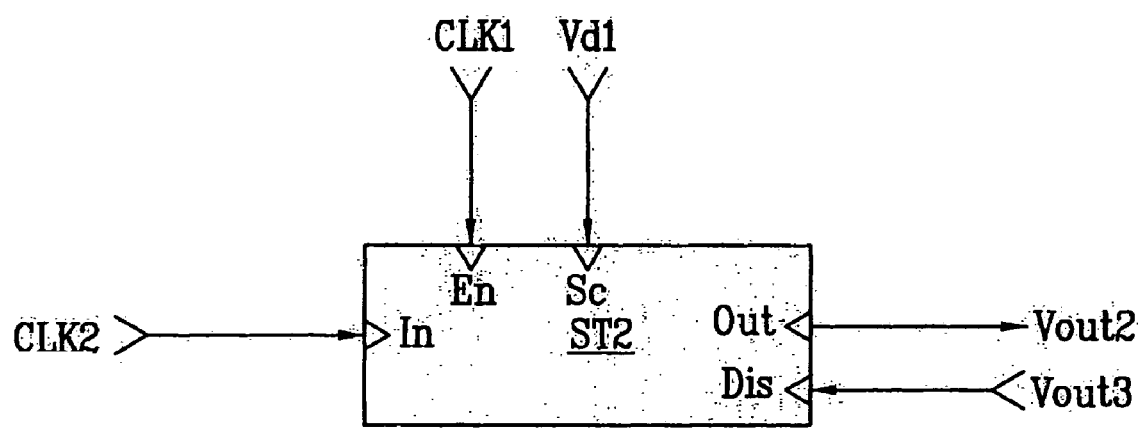
FIG. 12 is a block diagram of a second stage included in a first stage group shown in FIG. 11.

FIG. 12 is a block diagram of a second stage, ST2, of a stage group of FIG. 11. In FIG. 12, the stage may include an enable terminal En, a disable terminal Dis, an input terminal In, an output terminal Out, and a control terminal Cs. As shown in FIG. 11, a k-th stage may be enabled in response to a "k−1"-th clock pulse which may be supplied from the gate-driving IC 24 through the enable terminal En. In an enabled state, the k-th stage may receive a k-th clock pulse which may be supplied from the gate-driving IC 24 through the input terminal In of the k-th stage, and may supply an associated gate line with a scan pulse through the output terminal Out of the k-th stage. The scan pulse may be the received k-th clock pulse. The k-th stage may be disabled in response to a scan pulse supplied from the "k+1"-th stage (e.g., a "k+1"-th clock pulse output from the next stage).

The first stage ST1 of the first stage group SG1 may be enabled by a start pulse Vst supplied through the enable terminal En. In the enabled state, the first stage ST1 of the first stage group SG1 may receive the first clock pulse CLK1, and may output the received first clock pulse CLK1 as the first scan pulse Vout1. The first stage ST1 of the first stage group SG1 may be disabled by the second scan pulse Vout2 from the second stage ST2 of the first stage group SG1. The second scan pulse Vout2 may be supplied to the disable terminal Dis of the first stage ST1.

The k-th clock pulse supplied to each stage group SG1, SG2, SG3, or SG4 may be supplied to the input terminal In of the k-th stage and the enable terminal En of the "k+1"-th stage. The scan pulse output from the output terminal Out of the k-th stage may be supplied to the disable terminal Dis of the "k−1"-th stage. Each stage group may be supplied with a number of clock pulses that is identical to the number of stages included in the stage group. Each of the supplied clock pulses may be supplied to the input terminal In of the current stage and the enable terminal En of the next stage. Additionally each stage may be disabled in response to a scan pulse from the next stage.

The last clock pulse supplied to each stage group SG1, SG2, SG3, or SG4 (e.g., the fourth clock pulse CLK4) may be supplied to the input terminal In of the last stage (e.g., the fourth stage ST4) in a current stage group, and to the enable terminal En of the first stage (e.g., the first stage ST1) in a next stage group. The scan pulse output from the output terminal Out of the first stage (e.g., the first stage ST1) in each stage groups, except for the first stage group, may be supplied to an associated gate line and to the disable terminal Dis of the last stage (e.g., the fourth stage ST4) in the previous stage group. In this case, a clock pulse from the gate-driving circuit 24 may be supplied to the disable terminal Dis of a stage in a last stage group (e.g., the fourth stage ST4 of the fourth stage group SG4) because there is no stage downstream from the stage which may output a scan pulse.

Alternatively, a dummy stage may be arranged downstream from the final stage of a last stage group (e.g., the fourth stage ST4 of the fourth stage group SG4), in order to output a dummy scan pulse which may be used to disable the stage. The dummy stage may have the same configuration as that of the other stages included in the shift register. The dummy stage may be enabled by a clock pulse from the gate-driving IC 24, and may output a dummy scan pulse.

A control signal from the output controller 50 may be supplied to the control terminal Cs of each of the stages ST1 to ST4. Control voltages, such as Vd1 to Vd4 may be used as control signals. The number of control signals may be identical to the number of the stage groups in the shift register. The periods of the first to fourth control voltages Vd1 to Vd4 may be as previously described.

Figure 13:
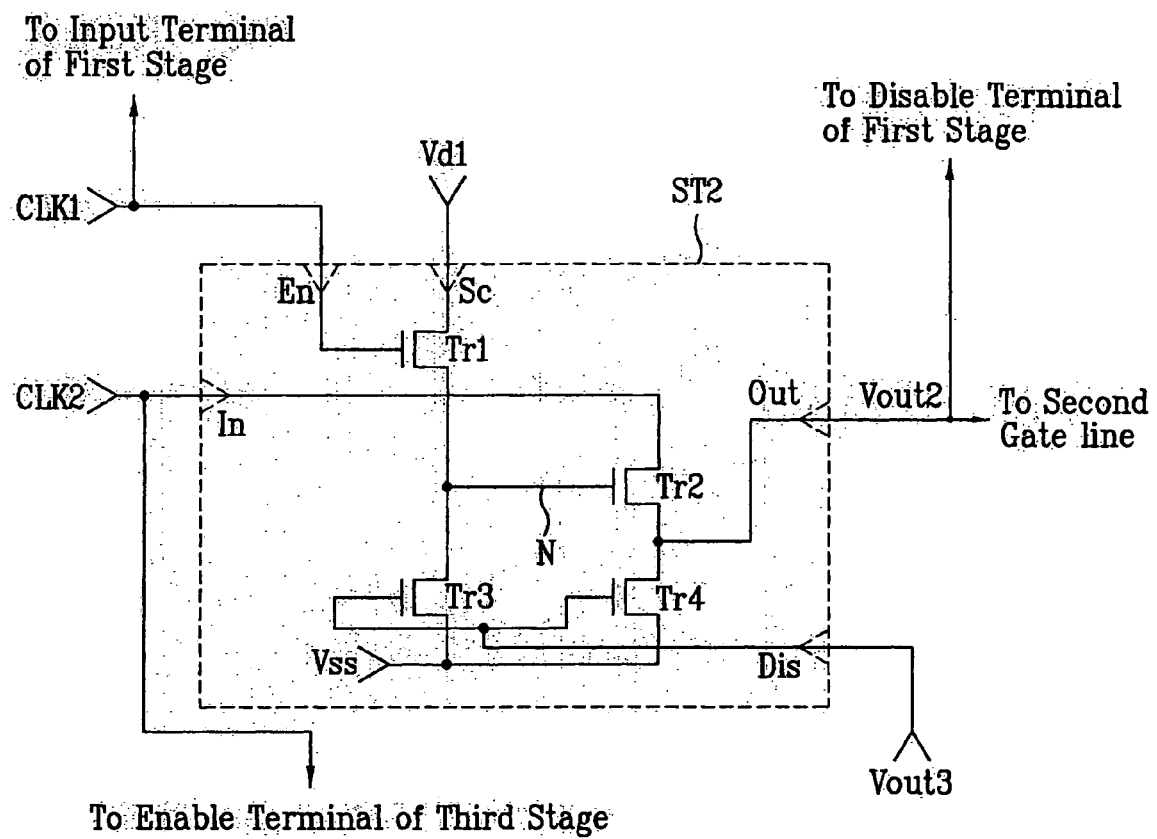
FIG. 13 is a circuit diagram of the second stage included in the first stage group of FIG. 11.

FIG. 13 is a circuit diagram of the second stage included in the first stage group of FIG. 11. The stage may include first to fourth switching devices Tr1 to Tr4. Other stages, such as ST1, ST3, and ST4, may have similar configurations.

The first switching device Tr1 of a k-th stage may supply a control voltage to a node N in response to a "k−1"-th clock pulse which may be supplied from the gate-driving IC 24. The node N may be charged or discharged in according to the logic level of the control voltage.

In FIG. 13, the gate terminal of the first switching device Tr1 is connected, at the enable terminal En, to the output terminal of the gate-driving IC 24 supplying the "k−1"-th clock pulse. The drain terminal of the first switching device Tr1 is connected, at the control terminal Cs, to the output terminal of the output controller 50 supplying the control voltage. The source terminal of the first switching device Tr1 is connected to the node N.

The second switching device Tr2 controls the stage's output according to the state of the node N. The second switching device Tr2 outputs the k-th clock pulse, as a scan pulse, when the node N is in a charging state. When the node N is in a discharging state, the second switching device Tr2 may prevent the output of the k-th clock pulse.

The gate terminal of the second switching device Tr2 is connected to the node N. The drain terminal of the second switching device Tr2 is connected, at the input terminal In, to the output terminal of the gate-driving IC 24 supplying the k-th clock pulse. The source terminal of the second switching device Tr2 is connected to an associated gate line through the output terminal Out.

The third switching device Tr3 may discharge the node N with a discharging voltage Vss according to a scan pulse from the "k+1"-th stage. The gate terminal of the third switching device Tr3 is connected, at the disable terminal Dis, to the output terminal Out of the "k+1"-th stage. The drain terminal of the third switching device Tr3 is connected to the node N. The source terminal of the third switching device Tr3 is connected to a power supply line which supplies the discharging voltage Vss.

The fourth switching device Tr4 may output the discharging voltage Vss to the associated gate line according to the scan pulse from the "k+1"-th stage. The gate terminal of the fourth switching device Tr4 is connected, at the disable terminal Dis, to the output terminal Out of the "k+1"-th stage. The drain terminal of the fourth switching device Tr4 is connected, at the output terminal Out, to the associated gate line. The source terminal of the fourth switching device Tr4 is connected to the power supply line which supplies the discharging voltage Vss.

In FIG. 13, the first switching device Tr1 included in the second stage ST2 of the first stage group SG1 may charge or discharge the node N with the first control voltage Vd1 in response to the first clock pulse CLK1. The second switching device Tr2 may output the second clock pulse CLK2 to the second gate line according to the state of the node N. The third switching device Tr3 may discharge the node N with the discharging voltage Vss in response to the third scan pulse Vout3 from the third stage ST3. The fourth switching device Tr4 may supply the discharging voltage Vss to the second gate line in response to the third scan pulse Vout3 from the third stage ST3.

If the first control voltage Vd1 has a high logic level, and the remaining second to fourth control voltages Vd2 to Vd4 have a low logic level, then the second stage ST2 of the first stage group SG1 outputs the second clock pulse CLK2 as the second scan pulse Vout2. In response to the low logic level of control voltages Vd2 to Vd4, the second stage ST2 of the remaining stage groups to which the second to fourth control voltages Vd2 to Vd4 are applied, respectively, may not generate an output.

The first and second clock pulses CLK1 and CLK2 may also be supplied to the second stage ST2 of the remaining stage groups. The first clock pulse CLK1 may be supplied to the first switching device Tr1 of the second stage ST2 of the remaining stage groups. The second clock pulse CLK2 may be supplied to the second switching device Tr2 of the second stage ST2 of the remaining stage groups. The node N in the second stage ST2 of the remaining stage groups is in a discharging state because the control voltages supplied to the node N through the first switching device Tr1 have a low logic level.

As a result, the second clock pulse CLK2 supplied to the drain terminal of the second switching device Tr2 cannot be output. Thus, when the second stage ST2 of the first stage group SG1 generates an output, the second stage ST2 of the remaining stage groups does not generate an output.

Figure 14:
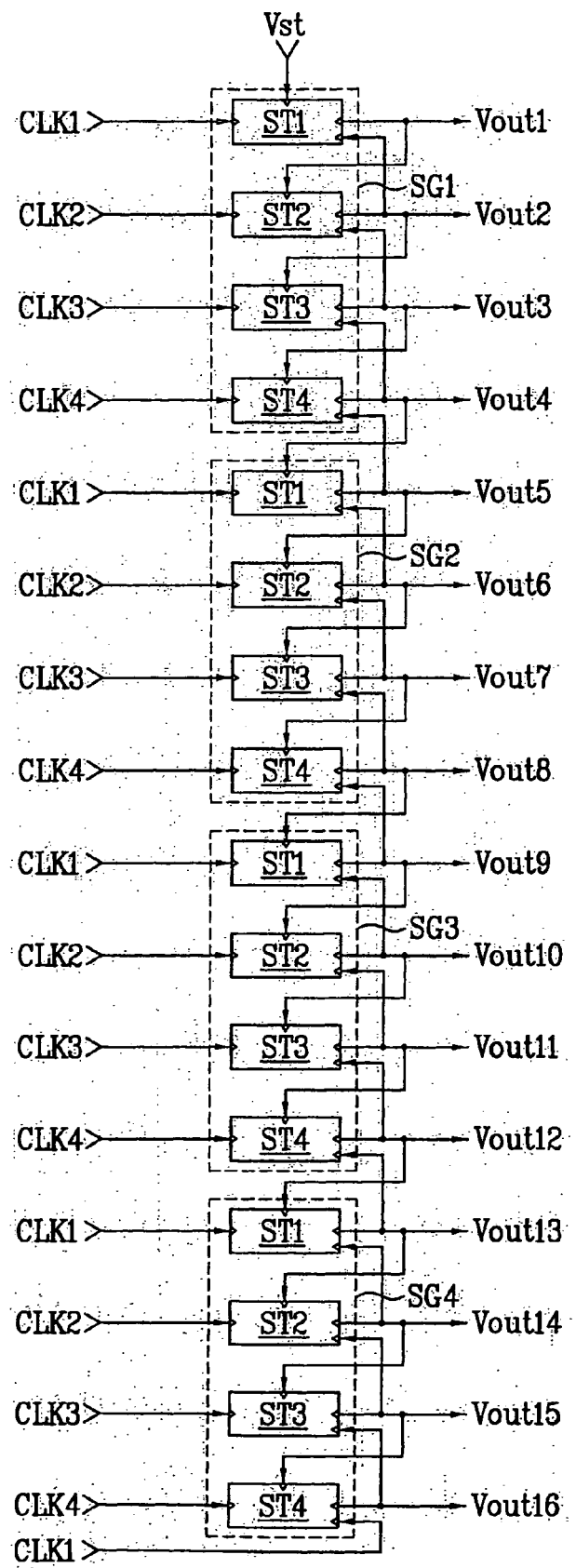
FIG. 14 is a fifth block diagram of a shift register of FIG. 2.
Figure 17:
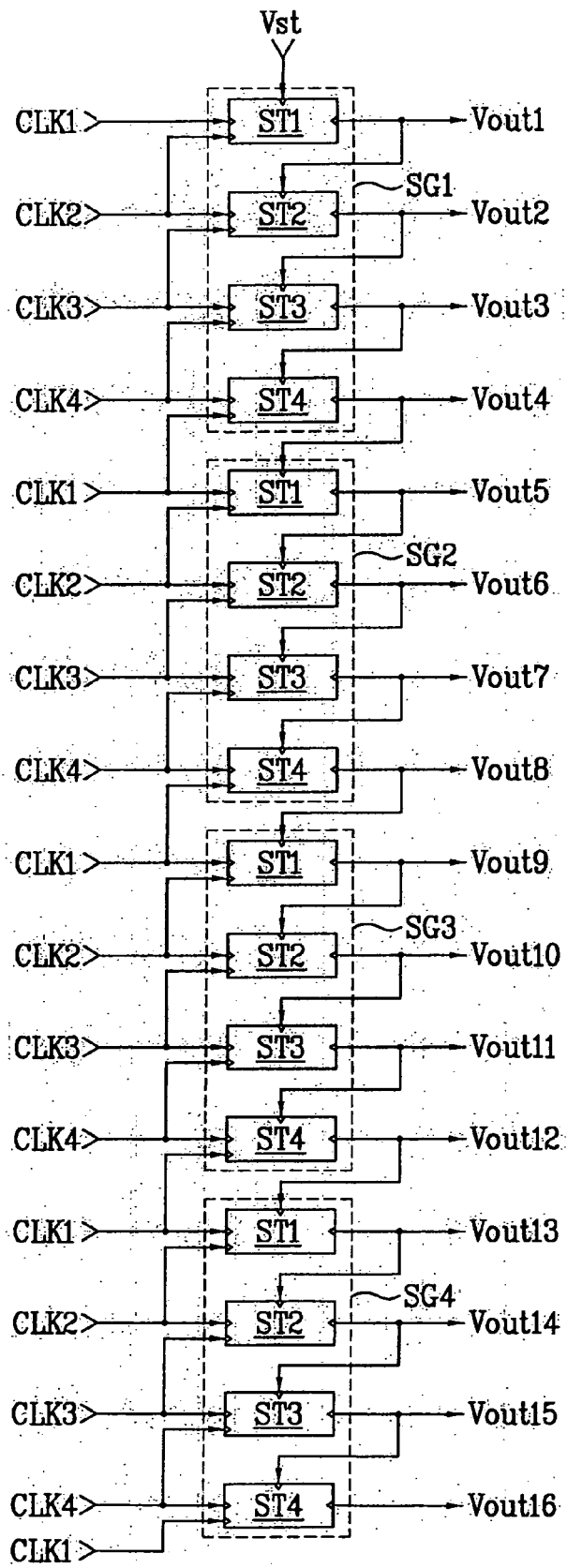
FIG. 17 is a sixth block diagram of a shift register of FIG. 2.
Figure 20:
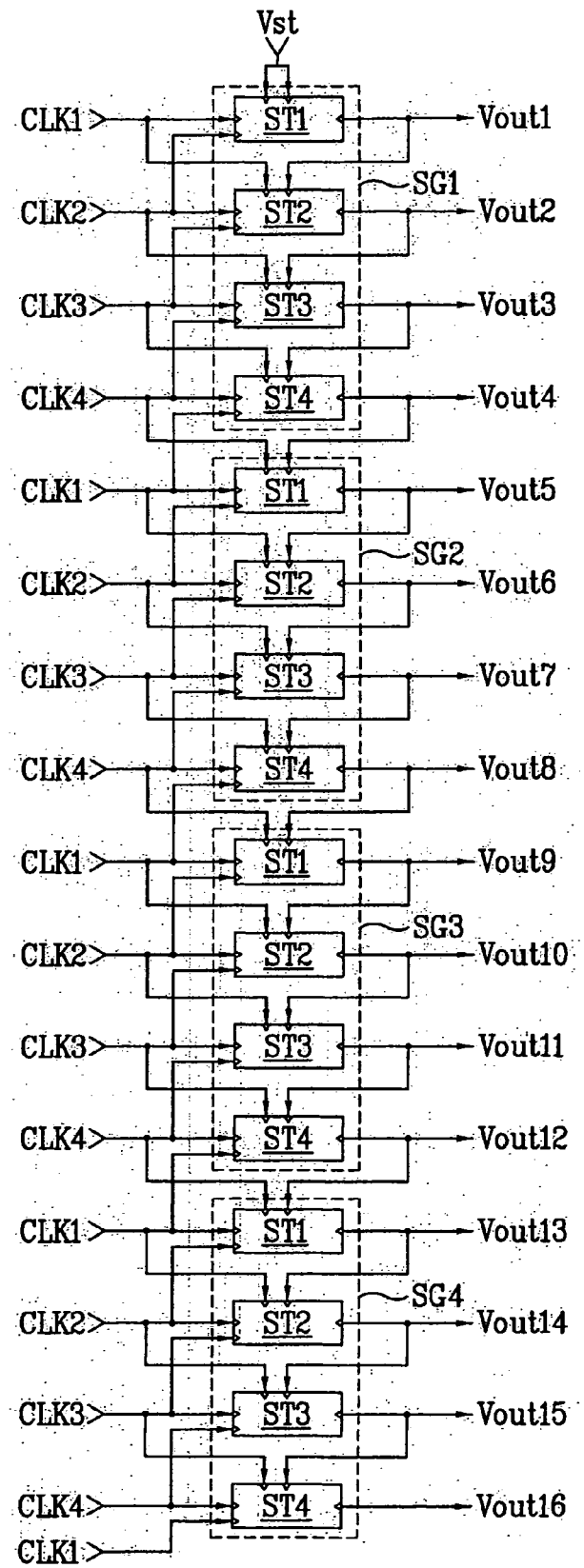
FIG. 20 is a seventh block diagram of a shift register of FIG. 2.

The shift register SR of FIGS. 14, 17, and 20 may or may not receive a control signal from the output controller 50. The following description describes the situation in which the shift register SR receives no control signal from the output controller 50.

FIG. 14 is a fifth block diagram of a shift register of FIG. 2. In FIG. 14, the k-th stage ("k" may be a natural number greater than or equal to 2) of each stage group SG1, SG2, SG3, or SG4 may be enabled in response to a scan pulse from the "k−1"-th stage. In an enabled state, the k-th stage receives a k-th clock pulse supplied from the gate-driving IC 24, and may output the received clock pulse, as a scan pulse. The output scan pulse from the k-th stage may be supplied to both the "k+1"-th stage to enable the stage, and the "k−1"-th stage to disable that stage.

Figure 15:
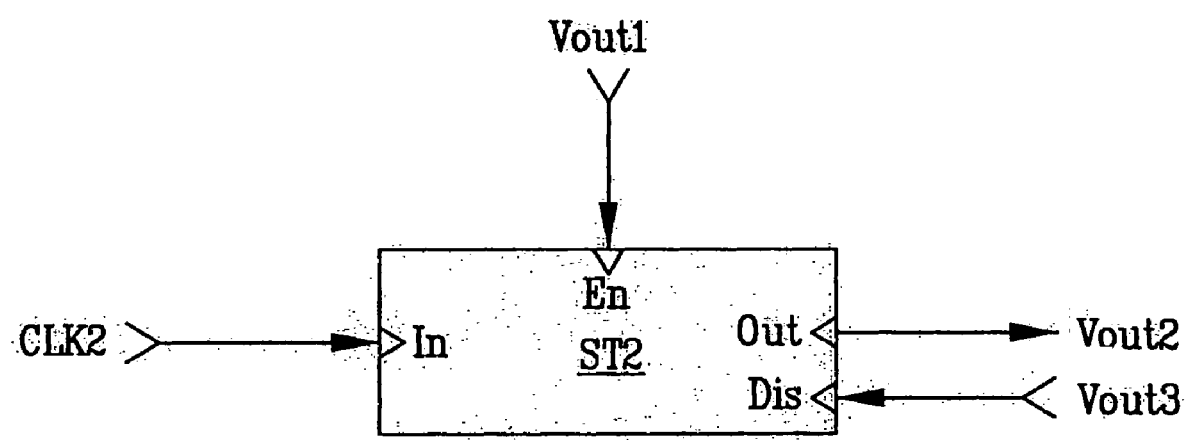
FIG. 15 is a block diagram of a second stage included in a first stage group shown in FIG. 14.

FIG. 15 is a block diagram of a second stage, ST2, of a stage group of FIG. 14. In FIG. 15, the stage may have an enable terminal En, a disable terminal Dis, an input terminal In, and an output terminal Out. Other stages, such as ST1, ST3, and ST4, may be similarly configured. As shown in FIG.

14, a k-th stage of each stage group SG1, SG2, SG3, or SG4 may be enabled in response to a "k−1"-th scan pulse output from the output terminal Out of the "k−1"-th stage and supplied to the enable terminal En of the k-th stage. In an enabled state, the k-th stage may receive a k-th clock pulse which may be supplied from the gate-driving IC 24 through the input terminal In of the k-th stage, and may supply the k-th clock pulse, as a scan pulse, to an associated gate line through the output terminal Out of the k-th stage. The k-th stage may also supply the scan pulse to the enable terminal En of the "k+1"-th stage.

The first stage ST1 of the first stage group SG1 may be enabled by a start pulse Vst supplied through the enable terminal En. In the enabled state, the first stage ST1 of the first stage group SG1 may receive the first clock pulse CLK1, and may output the received first clock pulse CLK1 as the first scan pulse Vout1. The first stage ST1 of the first stage group SG1 may be disabled by the second scan pulse Vout2 from the second stage ST2 of the first stage group SG1 supplied to the disable terminal Dis of the first stage ST1.

The scan pulse output from the output terminal Out of the first stage (e.g., the first stage ST1) in each of the stage groups, except for the first stage group, may be supplied to an associated gate line, to the enable terminal En of the second stage in the current stage group, and to the disable terminal Dis of the last stage (e.g., the fourth stage ST4) in the previous stage group. Also, the scan pulse output from the last stage (e.g., the fourth stage ST4) in each stage group SG1, SG2, SG3, or SG4 may be supplied to an associated gate line, to the disable terminal Dis of the previous stage (e.g., third stage ST3) of the current stage group, and to the enable terminal En of the first stage (e.g., the first stage ST1) in the next stage group.

A clock pulse from the gate-driving circuit 24 may be supplied to the disable terminal Dis of the last stage of a last stage group (e.g., a fourth stage ST4 of a fourth stage group SG4) because there is no stage downstream from this stage.

Alternatively, a dummy stage may be arranged downstream from the last stage of a last stage group (e.g., the fourth stage ST4 of the fourth stage group SG4), in order to output a dummy scan pulse for disabling this last stage. The dummy stage may have the same configuration as that of the other stages. The dummy stage may be enabled by a scan pulse from the last stage of the last stage group to output a dummy scan pulse.

The shift register SR in FIG. 14 may not require input from the output controller 50, which may be adapted to control outputs from the stages of the shift register SR, because each stage of the shift register SR may generate an output in response to an output from an upstream stage.

Figure 16:
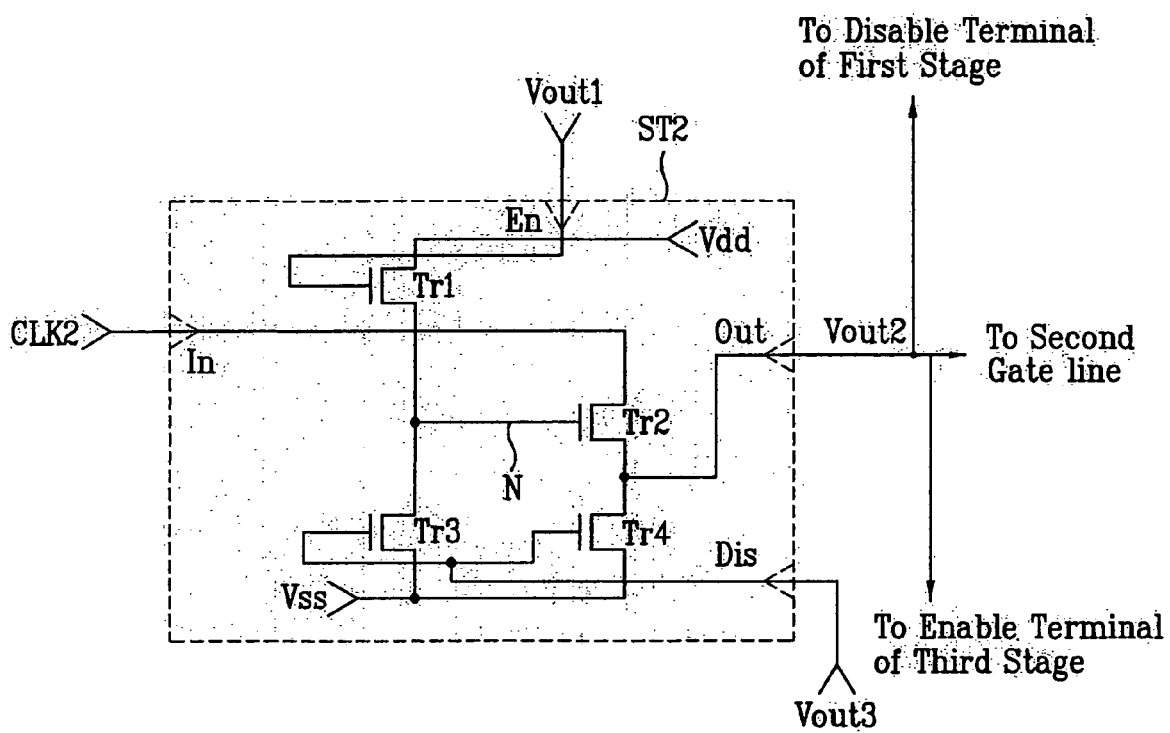
FIG. 16 is a circuit diagram of the second stage included in the first stage group of FIG. 14.

FIG. 16 is a circuit diagram of the second stage included in the first stage group of FIG. 14. The stage may include first to fourth switching devices Tr1 to Tr4. Other stages included within the shift register of FIG. 14 may have similar configurations.

When the stage is enable, the first switching device Tr1 of a k-th stage may charge a node N by supply a charging voltage Vdd to the node N according to a scan pulse from the "k−1"-th stage. In FIG. 16, the gate terminal of the first switching device Tr1 is connected, at the enable terminal En, to the output terminal Out of the "k−1"-th stage. The drain terminal of the first switching device Tr1 is connected to a power supply line which supplies the charging voltage Vdd. The source terminal of the first switching device Tr1 is connected to the node N.

The second switching device Tr2 of the k-th stage may output, as a scan pulse, a k-th clock pulse supplied from the gate-driving IC 24, when the node N is in a charging state. The scan pulse which may be output from the second switching device Tr2, at the output terminal Out, may be supplied to the enable terminal En of the "k+1"-th stage, and to the disable terminal Dis of the "k−1"-th stage.

The gate terminal of the second switching device Tr2 is connected to the node N. The drain terminal of the second switch device Tr2 is connected, at the input terminal In, to the output terminal of the gate-driving IC 24 supplying the k-th clock pulse. The source terminal of the second switching device Tr2 is connected, at the output terminal Out, to an associated gate line, to the enable terminal En of the "k+1"-th stage, and to the disable terminal Dis of the "k−1"-th stage.

The third switching device Tr3 of the k-th stage may discharge the node N with a discharging voltage Vss according to a scan pulse from the "k+1"-th stage. The gate terminal of the third switching device Tr3 is connected, at the disable terminal Dis, to the output terminal Out of the "k+1"-th stage. The drain terminal of the third switching device Tr3 is connected to the node N. The source terminal of the third switching device Tr3 is connected to a power supply line which supplies the discharging voltage Vss.

The fourth switching device Tr4 of the k-th stage may output the discharging voltage Vss to the associated gate line, to the enable terminal En of the "k+1"-th stage, and to the disable terminal Dis of the "k−1"-th stage according to the scan pulse from the "k+1"-th stage. The gate terminal of the fourth switching device Tr4 is connected, at the disable terminal Dis, to the output terminal Out of the "k+1"-th stage. The drain terminal of the fourth switching device Tr4 is connected, at the output terminal Out, to the associated gate line, to the enable terminal En of the "k+1"-th stage, and to the disable terminal Dis of the "k−1"-th stage. The source terminal of the fourth switching device Tr4 is connected to the power supply line transferring the discharging voltage Vss.

In FIG. 16, the first switching device Tr1 included in the second stage ST2 of the first stage group SG1 may charge the node N by supplying the charging voltage Vdd to the node N in response to the first scan pulse Vout1 from the first stage ST1. The second switching device Tr2 may output the second clock pulse CLK2, as the second scan pulse Vout2, in response to the charging voltage Vdd supplied to the node N. The second scan pulse Vout2 from the second switching device Tr2 may be supplied to the associated gate line, to the enable terminal En of the third stage ST3, and to the disable terminal Dis of the first stage ST1. The third switching device Tr3 may supply the discharging voltage Vss to the node N in response to the third clock pulse CLK3, thereby discharging the node N. The fourth switching device Tr4 may output the discharging voltage Vss in response to the third clock pulse CLK3. The discharging voltage Vss from the fourth switching device Tr4 may be supplied to the associated gate line, to the enable terminal En of the third stage ST3, and to the disable terminal Dis of the first stage ST1.

FIG. 17 is a sixth block diagram of a shift register of FIG. 2. In FIG. 17, the k-th stage ("k" may be a natural number greater than or equal to 2) of each stage group SG1, SG2, SG3, or SG4 may be enabled in response to a scan pulse from the "k−1"-th stage and the k-th stage may be disabled in response to a "k+1"-th clock pulse from the gate-driving IC 24.

Figure 18:
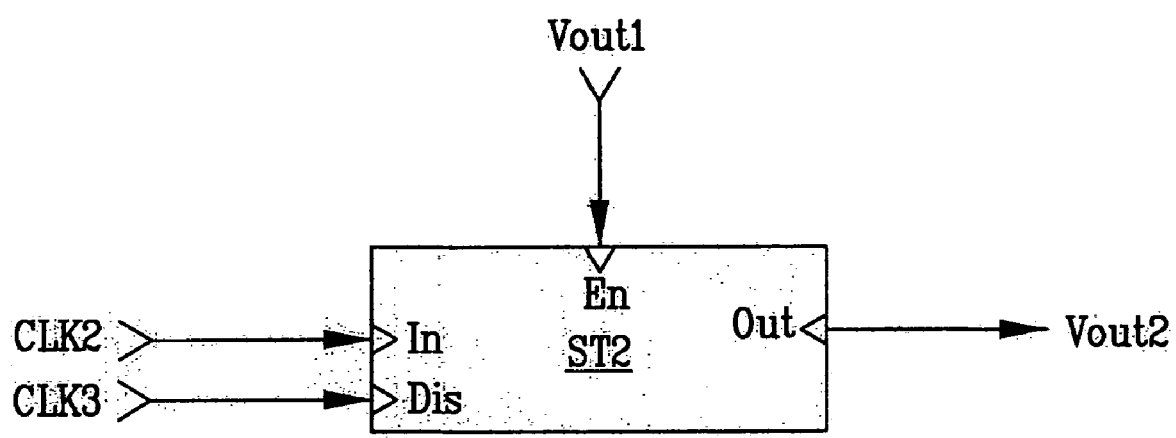
FIG. 18 is a block diagram of a second stage included in a first stage group shown in FIG. 17.

FIG. 18 is a block diagram of a second stage, ST2, of a stage group of FIG> 17. In FIG. 18, the stage may include an enable terminal En, a disable terminal Dis, an input terminal In, and an output terminal Out. Other stages of the shift register of FIG. 17 may have similar configurations. As shown in FIG. 17, a k-th stage of a stage group may be enabled in response to a "k−1"-th scan pulse output from the output terminal Out of the "k−1"-th stage and supplied to the enable terminal En of the k-th stage. In an enabled state, the k-th stage may receive a k-th clock pulse output from the gate-driving IC 24 through the input terminal In of the k-th stage. The k-th stage may supply the k-th clock pulse, as a scan pulse, to an associated gate line through the output terminal Out of the k-th stage. The k-th stage may also supply the scan pulse to the enable terminal En of the "k+1"-th stage. The k-th stage may also receive a "k+1"-th clock pulse which may have been output from the gate-driving IC 24 at the disable terminal Dis of the k-th stage, which may disable the k-th stage.

The first stage ST1 of the first stage group SG1 may be enabled by a start pulse Vst supplied through the enable terminal En. In the enabled state, the first stage ST1 of the first stage group SG1 may receive the first clock pulse CLK1, and may output the received first clock pulse CLK1 as the first scan pulse Vout1. The first stage ST1 of the first stage group SG1 may be disabled by supplying the second clock pulse CLK2 to the disable terminal Dis of the first stage ST1.

The k-th clock pulse supplied to each stage group SG1, SG2, SG3, and SG4 may be supplied to both the input terminal In of the k-th stage in the stage group and the disable terminal Dis of the "k−1"-th stage in the stage group. Each stage group may be supplied with a number of clock pulses identical to the number of stages included in the stage group. Each of the supplied clock pulses may be supplied to both the input terminal In of the current stage and the disable terminal Dis of the previous stage.

The scan pulse output from the last stage of a stage group SG1, SG2, SG3, or SG4 (e.g., the fourth stage ST4) may be supplied to an associated gate line, and to the enable terminal En of the first stage (e.g., the first stage ST1) in the next stage group. A clock pulse from the gate-driving circuit 24 may be supplied to the disable terminal Dis of the last stage of a last stage group (e.g., the fourth stage ST4 of the fourth stage group SG4) because there is no stage downstream from this stage.

Alternatively, a dummy stage may be arranged downstream from the last stage of a last stage group (e.g., the fourth stage ST4 of the fourth stage group SG4), in order to output a dummy scan pulse which may be used to disable this stage. The dummy stage may have the same configuration as that of the other stages. The dummy stage may be enabled by a scan pulse from the last stage of the last stage group (e.g., the fourth stage ST4 of the fourth stage group SG4), to output a dummy scan pulse.

The shift register SR in FIG. 17 may not require input from the output controller 50, which may be adapted to control outputs from the stages of the shift register SR, because each stage of the shift register SR may generate an output in response to an output from an upstream stage.

Figure 19:
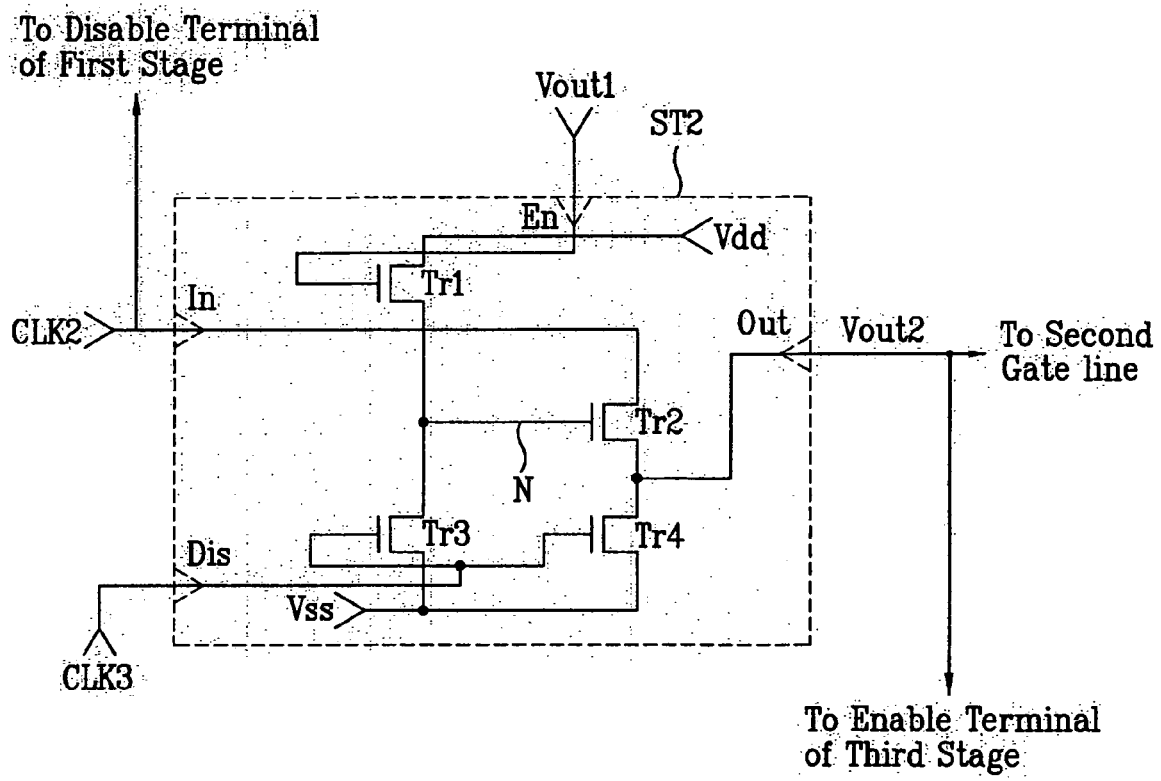
FIG. 19 is a circuit diagram of the second stage included in the first stage group of FIG. 17.

FIG. 19 is a circuit diagram of a second stage included in the first stage group of FIG. 17. The stage may include first to fourth switching devices Tr1 to Tr4. Other stages may have similar configurations.

When the stage is enabled, the first switching device Tr1 of a k-th stage may charge a node N by supply a charging voltage Vdd to the node N according to a scan pulse from the "k−1"-th stage. In FIG. 19, the gate terminal of the first switching device Tr1 is connected, at the enable terminal En, to the output terminal Out of the "k−1"-th stage. The drain terminal of the first switching device Tr1 is connected to a power supply line which supplied the charging voltage Vdd. The source terminal of the first switching device Tr1 is connected to the node N.

The second switching device Tr2 may output a k-th clock pulse, as a scan pulse, supplied from the gate-driving IC 24 when the node N is in a charging state. The k-th clock pulse from the second switching device Tr2 may be supplied to an associated gate line, and to the enable terminal En of the "k+1"-th stage.

The gate terminal of the second switching device Tr2 is connected to the node N. The drain terminal of the second switching device Tr2 is connected, at the input terminal In, to the output terminal of the gate-driving IC 24 supplying the k-th clock pulse. The source terminal of the second switching device Tr2 is connected, at the output terminal Out, to the associated gate line, and to the enable terminal En of the "k+1"-th stage.

The third switching device Tr3 may discharge the node N with a discharging voltage Vss according to the "k+1"-th clock pulse. The gate terminal of the third switching device Tr3 is connected, at the disable terminal, to the output terminal of the gate-driving IC 24 outputting the "k+1"-th clock pulse. The drain terminal of the third switching device Tr3 is connected to the node N. The source terminal is connected to a power supply line which supplies the discharging voltage Vss.

The fourth switching device Tr4 may output the discharging voltage Vss to the associated gate line, to the enable terminal En of the "k+1"-th stage, and to the disable terminal Dis of the "k−1"-th stage according to the scan pulse from the "k+1"-th stage. The gate terminal of the fourth switching device Tr4 is connected, at the disable terminal Dis, to the output terminal of the gate-driving IC 24 outputting the "k+1"-th clock pulse. The drain terminal of the fourth switching device Tr4 is connected, at the output terminal Out, to the associated gate line, and to the enable terminal En of the "k+1"-th stage. The source terminal of the fourth switching device Tr4 is connected to the power supply line which supplies the discharging voltage Vss.

In FIG. 19, the first switching device Tr1 included in the second stage ST2 of the first stage group SG1 may charge the node N by supplying the charging voltage Vdd to the node N in response to the first scan pulse Vout1 from the first stage ST1. The second switching device Tr2 may output the second clock pulse CLK2, as the second scan pulse Vout2, in response to the charging voltage Vdd supplied to the node N. The second scan pulse Vout2 from the second switching device Tr2 may be supplied to the associated gate line, and to the enable terminal En of the third stage ST3. The third switching device Tr3 may supply the discharging voltage Vss to the node N in response to the third clock pulse CLK3, thereby discharging the node N. The fourth switching device Tr4 may output the discharging voltage Vss in response to the third clock pulse CLK3. The discharging voltage Vss from the fourth switching device Tr4 may be supplied to the associated gate line, and to the enable terminal En of the third stage ST3.

FIG. 20 is a seventh block diagram of a shift register of FIG. 2. In FIG. 20, the k-th stage ("k" may be a natural number greater than or equal to 2) of each stage group SG1, SG2, SG3, or SG4 may be enabled in response to a "k−1"-th clock pulse from the gate-driving IC 24 and a clock pulse from the "k−1"-th stage. In an enabled state, the k-th stage may output a k-th clock pulse supplied from the gate-driving IC 24, as a scan pulse.

Figure 21:
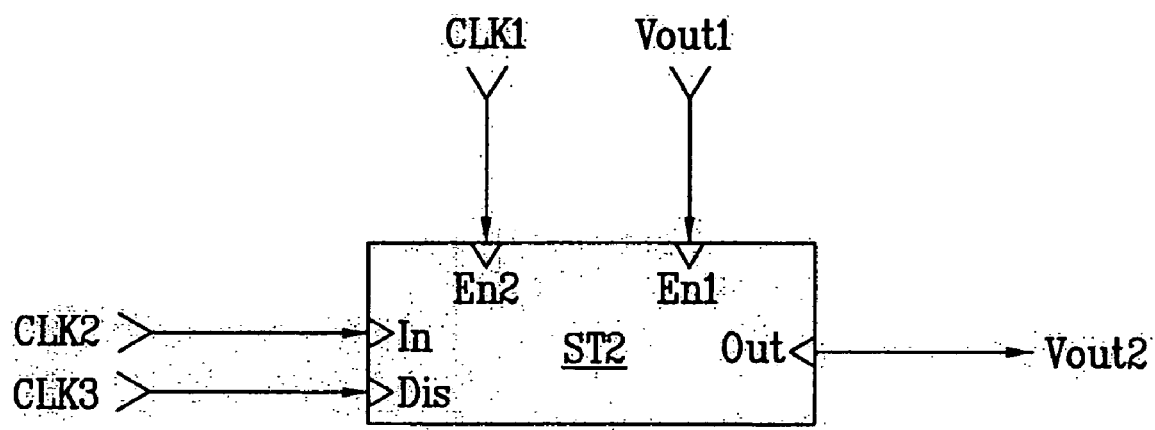
FIG. 21 is a block diagram of a second stage included in a first stage group shown in FIG. 20.

FIG. 21 is a block diagram of a second stage, ST2, of a stage group of FIG. 20. In FIG. 21, the stage may include a first enable terminal En1, a second enable terminal En2, a disable terminal Dis, an input terminal In, and an output terminal Out. Other stages of the shift register of FIG. 20 may have similar configurations. As shown in FIG. 20, a k-th stage of each stage group SG1, SG2, SG3, or SG4 in FIG. 20 may be enabled in response to the "k−1"-th clock pulse supplied to the first enable terminal En1 of the k-th stage and the scan pulse from the "k−1"-th stage supplied to the second enable terminal En2 of the k-th stage. In an enabled state, the k-th stage may receive a k-th clock pulse through the input terminal In of the k-th stage, and may supply an associated gate line with this clock pulse, as a scan pulse, through the output terminal Out of the k-th stage. The k-th stage may also receive a "k+1"-th clock pulse through the disable terminal Dis of the k-th stage, which may disable the stage.

The first stage ST1 of the first stage group SG1 may be enabled by a start pulse Vst supplied through the first and second enable terminals En1 and En2. In the enabled state, the first stage ST1 of the first stage group SG1 may receive the first clock pulse CLK1, and may output the received first clock pulse CLK1 as the first scan pulse Vout1. The first stage ST1 of the first stage group SG1 may be disabled by the second clock pulse CLK2.

The k-th clock pulse supplied to each stage group SG1, SG2, SG3, and SG4 may be supplied to the input terminal In of the k-th stage in the stage group, to the first enable terminal En1 of the "k+1"-th stage in the stage group, and to the disable terminal Dis of the "k−1"-th stage in the stage group. Each stage group may be supplied with a number of clock pulses identical to the number of stages included in the stage group. Each of the supplied clock pulses may be supplied to the input terminal In of the current stage, to the first enable terminal En1 of the next stage, and to the disable terminal Dis of the previous stage.

The scan pulse output from the last stage of each stage group SG1, SG2, SG3, or SG4 (e.g., the fourth stage ST4) may be supplied to an associated gate line, and to the second enable terminal En2 of the first stage (e.g., the first stage ST1) in the next stage group. The last clock pulse (e.g., the fourth clock pulse CLK4) supplied to each stage group SG1, SG2, SG3, or SG4 may be supplied to the input terminal In of the last stage (e.g., the fourth stage ST4) in the current stage group, to the disable terminal Dis of the previous stage (e.g., the third stage ST3) in the current stage group, and to the first enable terminal En1 of the first stage (e.g., the first stage ST1) in the next stage group. The scan pulse output from the last stage (e.g., the fourth stage) included in each stage group SG1, SG2, SG3, and SG4 may be supplied to an associated gate line, and to the second enable terminal EN2 of the first stage in the next stage group.

The shift register SR in FIG. 20 may not require input from the output controller 50, which may be adapted to control outputs from the stages of the shift register SR, because each stage of the shift register SR may generate an output in response to an output from an upstream stage and a clock pulse which may be simultaneously or almost simultaneously supplied to the current stage.

Figure 22:
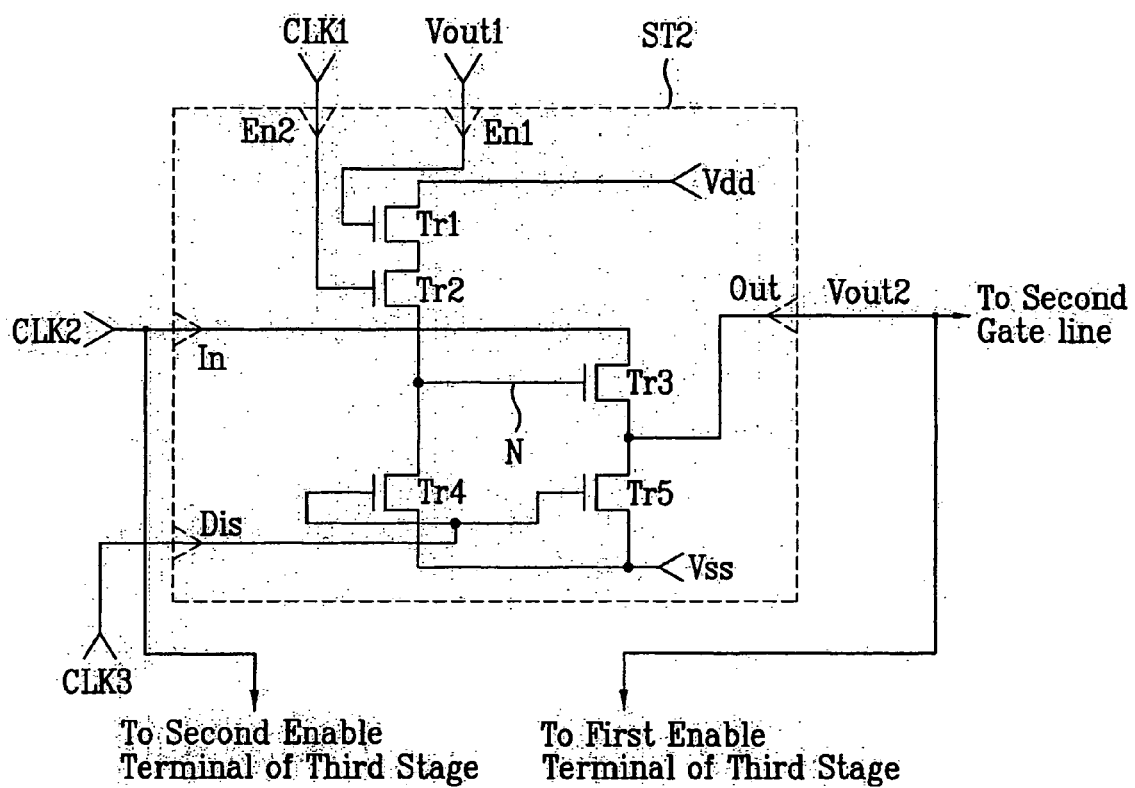
FIG. 22 is a circuit diagram of the second stage included in the first stage group of FIG. 20.

FIG. 22 is a circuit diagram of the second stage included in the first stage group of FIG. 20. Each of the stages ST1 to ST4 includes first to fifth switching devices Tr1 to Tr5. Other stages may have a similar configuration to the configuration of FIG. 22.

When the stage in enabled, the first switching device Tr1 of a k-th stage may charge a node N by supplying a charging voltage Vdd to the node N according to a scan pulse from the "k−1"-th stage. The gate terminal of the first switching device Tr1 is connected, at the first enable terminal En1, to the output terminal Out of the "k−1"-th stage. The drain terminal of the first switching device Tr1 is connected to a power supply line which supplies the charging voltage Vdd. The source terminal of the first switching device Tr1 is connected to the node N through the second switching device Tr2.

The second switching device Tr2 of the k-th stage may charge the node N with the charging voltage Vdd received through the first switching device Tr1 according to a "k−1"-th clock pulse supplied from the gate-driving IC 24. The gate terminal of the second switching device Tr2 is connected, at the second enable terminal En2, to the output terminal Out of the gate-driving IC 24 outputting the "k−1"-th clock pulse. The drain terminal of the second switching device Tr2 is connected to the source terminal of the first switching device Tr1. The source terminal of the second switching device Tr2 is connected to the node N.

The third switching device Tr3 of the k-th stage may receive and output a k-th clock pulse from the gate-driving IC 24 according to the charging voltage Vdd charged in the node N. The output k-th clock pulse may be supplied to the associated gate line, and to the second enable terminal En2 of the "k+1"-th stage. The gate terminal of the third switching device Tr3 is connected to the node N. The drain terminal of the third switching device is connected, at the input terminal In, to the output terminal of the gate-driving IC 24 outputting the k-th clock pulse. The source terminal of the third switching device Tr3 is connected, at the output terminal Out, to the associated gate line, and to the second enable terminal En2 of the "k+1"-th stage.

The fourth switching device Tr4 of the k-th stage may discharge the node N by outputting the discharging voltage Vss to the node N according to the scan pulse from the "k+1"-th stage. The gate terminal of the fourth switching device Tr4 is connected, at the disable terminal Dis, to the "k+1"-th clock pulse output from the gate-driving IC 24. The drain terminal of the fourth switching device Tr4 is connected to the node N. The source terminal of the fourth switching device Tr4 is connected to a power supply line which supplies the discharging voltage Vss.

The fifth switching device Tr5 of the k-th stage may supply the discharging voltage Vss to the associated gate line and the second enable terminal En2 of the "k+1"-th stage according to a scan pulse from the "k+1"-th stage. The gate terminal of the fifth switching device Tr5 is connected, at the disable terminal Dis, to the "k+1" clock pulse output from the gate-driving IC 24. The drain terminal of the fifth switching device Tr5 is connected, at the output terminal Out, to the associated gate line, and to the second enable terminal En2 of the "k+1"-th stage. The source terminal of the fifth switching device Tr5 is connected to the power supply line which supplies the discharging voltage Vss.

In FIG. 22, the first switching device Tr1 included in the second stage ST2 of the first stage group SG1 may output the charging voltage Vdd to the node N in response to the first scan pulse Vout1 from the first stage ST1. The second switching device Tr2 may output the charging voltage Vdd supplied from the first switching device Tr1 in response to the first clock pulse CLK1 from the gate-driving IC 24. The output charging voltage Vdd from the second switching device Tr2 may be supplied to the node N. Accordingly, the node N may be charged. The third switching device Tr3 may output the second clock pulse CLK2, as the second scan pulse Vout2, in response to the charging voltage Vdd supplied to the node N. The output second clock pulse CLK2 from the third switching device Tr3 may be supplied to the second gate line, and to the second enable terminal En2 of the third stage ST3. The fourth switching device Tr4 may discharge the node N with the discharging voltage Vss in response to the third scan pulse Vout3 from the third stage ST3. The fifth switching device Tr5 may output the discharging voltage Vss in response to the third scan pulse Vout3 from the third stage ST3. The output discharging voltage Vss from the fifth switching device Tr5 may be supplied to the second gate line, and to the second enable terminal En2 of the third stage ST3.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A gate driver comprising: a plurality of stages for supplying input clock pulses to associated gate lines of a liquid crystal panel, respectively;
   a gate-driving integrated circuit for dividing the stages into m stage groups each including n stages, and supplying n phase-different clock pulses to each of the stage groups; and
   an output controller that controls which of the plurality of stage groups generate an output signal,
   wherein m is a natural number greater than or equal to 2,
   wherein n is a natural number greater than or equal to 2,
   wherein the output controller controls the plurality of stages such that the stages sequentially output clock pulses in an order from an uppermost stream of one of the stage groups to a lowermost stream of one of the stage groups;
   wherein the output controller outputs m phase-different control voltages, and supplies each of the control voltages to the stages of an associated one of the stage groups, to control outputs from the plurality of stages;
   wherein each control voltage is maintained in a high state for an overall output enable period of the stages of the stage group receiving the control voltage, and is maintained in a low state for a period other than the output enable period;
   wherein: a k-th one of the clock pulses supplied to each stage group is supplied to an input terminal of a k-th one of the stages included in the stage group, and to an enable terminal of a "k+1"-th one of the stages included in the stage group;
   a last clock pulse supplied to an input terminal of a last one of the stages in each stage group is also supplied to an enable terminal of a first one of the stages in the stage group next to the stage group including the last stage receiving the last clock pulse; and
   a start pulse is externally supplied to an enable terminal of a first one of the stages in a first one of the stage groups, wherein k is a natural number greater than or equal to 2;
   wherein the control voltage supplied to the stages in an associated one of the stage groups is maintained in a high state for enable periods, during which clock pulses are supplied to enable terminals of the stages in the associated stage group, respectively, and for an enable period, during which a clock pulse is supplied to an enable terminal of a first one of the stages in the stage group next to the associated stage group; and
   wherein the control voltage is maintained in a low state for a period other than the enable periods.

2. The gate driver according to claim 1, wherein:
   the control voltage supplied to the stages in an associated one of the stage groups is maintained in a high state for enable periods, during which clock pulses are supplied to enable terminals of the stages in the associated stage group, except for the last stage of the associated stage group, respectively; and
   the control voltage is maintained in a low state for a period other than the enable periods.

3. The gate driver according to claim 2, wherein each stage comprises:
   a first switching device for outputting the control voltage supplied to the stage in accordance with the externally-supplied start pulse or a clock pulse supplied from the gate-driving integrated circuit via an enable terminal of the stage;
   a node which is charged or discharged in accordance with a logic value of the control voltage from the first switching device; and
   a second switching device for supplying a clock pulse supplied from the gate-driving integrated circuit via an input terminal of the stage to the gate line associated with the stage in accordance with a state of the node.

4. The gate driver according to claim 1, wherein each stage comprises:
   a first switching device for outputting the control voltage supplied to the stage in accordance with the externally-supplied start pulse or a clock pulse supplied from the gate-driving integrated circuit via an enable terminal of the stage;
   a node which is charged or discharged in accordance with a logic value of the control voltage from the first switching device; and
   a second switching device for supplying a clock pulse supplied from the gate-driving integrated circuit via an input terminal of the stage to the gate line associated with the stage in accordance with a state of the node.

5. The gate driver according to claim 1, wherein:
   a k-th one of the clock pulses supplied to each stage group is supplied to an input terminal of a k-th one of the stages included in the stage group, to an enable terminal of a "k+1"-th one of the stages included in the stage group, and to a disable terminal of a "k−1"-th one of the stages included in the stage group;
   a clock pulse finally supplied to each stage group is supplied to an input terminal of a last one of the stages in the stage group and to an enable terminal of a first one of the stages in the stage group next to the stage group including the last stage;
   a first clock pulse supplied to, other than a first one of the stage groups, each of the remaining ones of the stage groups, is supplied to an input terminal of a first one of the stages in the remaining stage group, to an enable terminal of a second one of the stages in the remaining stage group, and to a disable terminal of a last one of the stages in the stage group previous to the remaining stage group; and
   a start pulse is externally supplied to an enable terminal of a first one of the stages in a first one of the stage groups, wherein k is a natural number greater than or equal to 2.

6. The gate driver according to claim 5, wherein:
   the control voltage supplied to the stages in an associated one of the stage groups is maintained in a high state for enable periods, during which clock pulses are supplied to enable terminals of the stages in the associated stage group, except for the last stage of the associated stage group, respectively; and
   the control voltage is maintained in a low state for a period other than the enable periods.

7. The gate driver according to claim 6, wherein each stage comprises:
   a first switching device for outputting the control voltage supplied to the stage in accordance with the externally-supplied start pulse or a clock pulse supplied from the gate-driving integrated circuit via an enable terminal of the stage;
   a node which is charged or discharged in accordance with a logic value of the control voltage from the first switching device;
   a second switching device for supplying a clock pulse supplied from the gate-driving integrated circuit via an input terminal of the stage to the gate line associated with the stage in accordance with a state of the node;

a third switching device for discharging the node with a discharging voltage in accordance with a clock pulse supplied from the gate-driving integrated circuit via a disable terminal of the stage; and a fourth switching device for supplying the discharging voltage to the gate line associated with the stage in accordance with the clock pulse supplied from the gate-driving integrated circuit via the disable terminal of the stage.

8. The gate driver according to claim 5, wherein:

the control voltage supplied to the stages in an associated one of the stage groups is maintained in a high state for enable periods, during which clock pulses are supplied to enable terminals of the stages in the associated stage group, respectively, and for an enable period, during which a clock pulse is supplied to an enable terminal of a first one of the stages in the stage group next to the associated stage group; and the control voltage is maintained in a low state for a period other than the enable periods.

9. The gate driver according to claim 8, wherein each stage comprises:

a first switching device for outputting the control voltage supplied to the stage in accordance with the externally-supplied start pulse or a clock pulse supplied from the gate-driving integrated circuit via an enable terminal of the stage;

a node which is charged or discharged in accordance with a logic value of the control voltage from the first switching device;

a second switching device for supplying a clock pulse supplied from the gate-driving integrated circuit via an input terminal of the stage to the gate line associated with the stage in accordance with a state of the node;

a third switching device for discharging the node with a discharging voltage in accordance with a clock pulse supplied from the gate-driving integrated circuit via a disable terminal of the stage; and a fourth switching device for supplying the discharging voltage to the gate line associated with the stage in accordance with the clock pulse supplied from the gate-driving integrated circuit via the disable terminal of the stage.

10. The gate driver according to claim 1, wherein:

a k-th one of the clock pulses supplied to each stage group is supplied to an input terminal of a k-th one of the stages included in the stage group and to an enable terminal of a "k+1"-th one of the stages included in the stage group;

a clock pulse finally supplied to each stage group is supplied to an input terminal of a last one of the stages in the stage group and to an enable terminal of a first one of the stages in the stage group next to the stage group including the last stage;

the clock pulse output from each stage in each stage group is supplied to the gate line associated with the stage and to a disable terminal of the stage previous to the stage outputting the clock pulse; and a start pulse is externally supplied to an enable terminal of a first one of the stages in a first one of the stage groups, wherein k is a natural number greater than or equal to 2.

11. The gate driver according to claim 10, wherein:

the control voltage supplied to the stages in an associated one of the stage groups is maintained in a high state for enable periods, during which clock pulses are supplied to enable terminals of the stages in the associated stage group, except for the last stage of the associated stage group, respectively; and the control voltage is maintained in a low state for a period other than the enable periods.

12. The gate driver according to claim 11, wherein each stage comprises:

a first switching device for outputting the control voltage supplied to the stage in accordance with the externally-supplied start pulse or a clock pulse supplied from the gate-driving integrated circuit via an enable terminal of the stage;

a node which is charged or discharged in accordance with a logic value of the control voltage from the first switching device;

a second switching device for supplying a clock pulse supplied from the gate-driving integrated circuit via an input terminal of the stage to the gate line associated with the stage and to a disable terminal of the stage previous to the stage associated with the gate line in accordance with a state of the node;

a third switching device for discharging the node with a discharging voltage in accordance with a clock pulse supplied from the stage next to the stage associated with the gate line; and a fourth switching device for supplying the discharging voltage to the gate line and to the disable terminal of the previous stage in accordance with the clock pulse supplied from the next stage.

13. The gate driver according to claim 10, wherein:

the control voltage supplied to the stages in an associated one of the stage groups is maintained in a high state for enable periods, during which clock pulses are supplied to enable terminals of the stages in the associated stage group, respectively, and for an enable period, during which a clock pulse is supplied to an enable terminal of a first one of the stages in the stage group next to the associated stage group; and the control voltage is maintained in a low state for a period other than the enable periods.

14. The gate driver according to claim 13, wherein each stage comprises:

a first switching device for outputting the control voltage supplied to the stage in accordance with the externally-supplied start pulse or a clock pulse supplied from the gate-driving integrated circuit via an enable terminal of the stage;

a node which is charged or discharged in accordance with a logic value of the control voltage from the first switching device;

a second switching device for supplying a clock pulse supplied from the gate-driving integrated circuit via an input terminal of the stage to the gate line associated with the stage and to a disable terminal of the stage previous to the stage associated with the gate line in accordance with a state of the node;

a third switching device for discharging the node with a discharging voltage in accordance with a clock pulse supplied from the stage next to the stage associated with the gate line; and a fourth switching device for supplying the discharging voltage to the gate line and to the disable terminal of the previous stage in accordance with the clock pulse from the next stage.

* * * * *